US010229927B2

(12) United States Patent
Lee et al.

(10) Patent No.: US 10,229,927 B2
(45) Date of Patent: Mar. 12, 2019

(54) SEMICONDUCTOR DEVICE AND METHOD OF MANUFACTURING THE SEMICONDUCTOR DEVICE

(71) Applicant: SAMSUNG ELECTRONICS CO., LTD., Suwon-si, Gyeonggi-Do (KR)

(72) Inventors: Dohyun Lee, Gyeonggi-do (KR); Jaegoo Lee, Gyeonggi-do (KR); Young-Jin Kwon, Gyeonggi-do (KR); Youngwoo Park, Seoul (KR); Jaeduk Lee, Gyeonggi-do (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 14/725,476

(22) Filed: May 29, 2015

(65) Prior Publication Data

US 2016/0005760 A1    Jan. 7, 2016

(30) Foreign Application Priority Data

Jul. 1, 2014    (KR) .................. 10-2014-0081956

(51) Int. Cl.
*H01L 27/115*    (2017.01)
*H01L 27/11582*    (2017.01)
(Continued)

(52) U.S. Cl.
CPC .... *H01L 27/11582* (2013.01); *H01L 27/1157* (2013.01); *H01L 29/1033* (2013.01); *H01L 29/7926* (2013.01)

(58) Field of Classification Search
CPC ......... H01L 27/11582; H01L 27/11578; H01L 27/11568; H01L 29/1033; H01L 29/7926
See application file for complete search history.

(56) References Cited

U.S. PATENT DOCUMENTS 7,539,056 B2    5/2009    Katsumata et al.
7,847,334 B2    12/2010    Katsumata et al.
(Continued)

FOREIGN PATENT DOCUMENTS

KR    1020100100397    9/2010
KR    1020110070143    6/2011
KR    1020120003351    1/2012

*Primary Examiner* — Victoria K Hall
(74) *Attorney, Agent, or Firm* — F. Chau & Associates, LLC

(57) ABSTRACT

A semiconductor device includes a lower stack structure including lower gate electrodes and lower insulating layers that are alternately and repeatedly stacked on a substrate. The semiconductor device includes an upper stack structure including upper gate electrodes and upper insulating layers that are alternately and repeatedly stacked on the lower stack structure. A lower channel structure penetrates the lower stack structure. An upper channel structure penetrates and is connected to the upper stack structure. A lower vertical insulator is disposed between the lower stack structure and the lower channel structure. The lower channel structure includes a first vertical semiconductor pattern connected to the substrate, and a first connecting semiconductor pattern disposed on the first vertical semiconductor pattern. The upper channel structure includes a second vertical semiconductor pattern electrically connected to the first vertical semiconductor pattern with the first connecting semiconductor pattern disposed therebetween.

15 Claims, 25 Drawing Sheets

(51) Int. Cl.
*H01L 29/10*   (2006.01)
*H01L 29/792*  (2006.01)
*H01L 27/1157* (2017.01)

(56) References Cited

U.S. PATENT DOCUMENTS

| | | |
|---|---|---|
| 8,013,389 B2 | 9/2011 | Oh et al. |
| 8,278,170 B2 | 10/2012 | Lee et al. |
| 8,343,820 B2 | 1/2013 | Jung |
| 8,394,716 B2 | 3/2013 | Hwang et al. |
| 8,455,940 B2 | 6/2013 | Lee et al. |
| 2009/0146206 A1* | 6/2009 | Fukuzumi ........... H01L 21/8221 257/324 |
| 2011/0065270 A1 | 3/2011 | Shim et al. |
| 2011/0287612 A1* | 11/2011 | Lee ................... H01L 27/11565 438/478 |
| 2011/0316064 A1* | 12/2011 | Kim ................. H01L 27/11582 257/314 |
| 2012/0003800 A1* | 1/2012 | Lee ................... H01L 27/11551 438/261 |
| 2012/0156848 A1* | 6/2012 | Yang ................ H01L 27/11529 438/287 |
| 2013/0277731 A1 | 10/2013 | Goda et al. |
| 2015/0098274 A1* | 4/2015 | Rhie ................. G11C 16/0483 365/185.17 |
| 2016/0104717 A1* | 4/2016 | Lu ..................... G11C 16/0483 365/185.22 |

* cited by examiner

SEMICONDUCTOR DEVICE AND METHOD OF MANUFACTURING THE SEMICONDUCTOR DEVICE

CROSS-REFERENCE TO RELATED APPLICATION

This U.S. non-provisional patent application claims priority under 35 U.S.C. § 119 to Korean Patent Application No. 10-2014-0081956, filed on Jul. 1, 2014, in the Korean Intellectual Property Office, the disclosure of which is incorporated by reference herein in its entirety.

TECHNICAL FIELD

Exemplary embodiments of the present inventive concept relate to a semiconductor device and a method of manufacturing the semiconductor device.

DISCUSSION OF RELATED ART

Semiconductor devices are becoming more highly integrated to provide high performance and low costs. A degree of integration of a two-dimensional (2D) or planar memory device may be determined by an area which a unit memory cell occupies. Therefore, the integration density of the 2D memory device may be affected by a technique of forming fine patterns. However, since extremely high-priced apparatuses may be needed to form fine patterns, the integration density of 2D memory devices may be limited by costs.

Three-dimensional (3D) semiconductor devices including three-dimensionally arranged memory cells have been developed and may overcome the above limitations. However, production of 3D semiconductor memory devices may be expensive as compared with 2D semiconductor memory devices and may have limitations regarding providing reliable device characteristics.

SUMMARY

Exemplary embodiments of the present inventive concept may provide 3D semiconductor memory devices capable of improving a connection structure between a lower channel structure and an upper channel structure.

Exemplary embodiments of the present inventive concept may provide methods of manufacturing a 3D semiconductor memory device capable of simplifying manufacturing processes.

According to an exemplary embodiment of the present inventive concept, a semiconductor device includes a lower stack structure including lower gate electrodes and lower insulating layers that are alternately and repeatedly stacked on a substrate. The semiconductor device includes an upper stack structure including upper gate electrodes and upper insulating layers that are alternately and repeatedly stacked on the lower stack structure. A lower channel structure penetrates the lower stack structure. The lower channel structure is connected to the substrate. An upper channel structure penetrates the upper stack structure. The upper channel structure is connected to the lower channel structure. A lower vertical insulator is disposed between the lower stack structure and the lower channel structure. The lower channel structure includes a first vertical semiconductor pattern connected to the substrate, and a first connecting semiconductor pattern disposed on the first vertical semiconductor pattern. The upper channel structure includes a second vertical semiconductor pattern electrically connected to the first vertical semiconductor pattern with the first connecting semiconductor pattern disposed therebetween. A top surface of the lower channel structure is at a different level from a top surface of the lower vertical insulator.

In some exemplary embodiments of the present inventive concept, the top surface of the lower vertical insulator may be substantially coplanar with a top surface of the lower stack structure.

In some exemplary embodiments of the present inventive concept, a top surface of the first connecting semiconductor pattern may be in direct contact with a bottom surface of the second vertical semiconductor pattern.

In some exemplary embodiments of the present inventive concept, the first connecting semiconductor pattern may include N-type dopants.

In some exemplary embodiments of the present inventive concept, the semiconductor device may include a dummy gate electrode adjacent to a contact portion of the lower and upper channel structures.

In some exemplary embodiments of the present inventive concept, the semiconductor device may include an upper vertical insulator disposed between the upper stack structure and the upper channel structure. An inner sidewall of an upper portion of the lower vertical insulator may be in direct contact with an outer sidewall of a lower portion of the upper vertical insulator.

In some exemplary embodiments of the present inventive concept, the upper channel structure may penetrate the upper stack structure and an upper portion of the lower stack structure. The second vertical semiconductor pattern may be in direct contact with the first connecting semiconductor pattern disposed in the upper portion of the lower stack structure.

In some exemplary embodiments of the present inventive concept, a bottom portion of the second vertical semiconductor pattern may be disposed in a recessed hole. The recessed hole may be disposed between the first connecting semiconductor pattern and the upper stack structure.

In some exemplary embodiments of the present inventive concept, an outer sidewall of the second vertical semiconductor pattern may have a stepped profile at a contact portion between the lower stack structure and the upper stack structure.

In some exemplary embodiments of the present inventive concept, a bottom surface of the upper vertical insulator may be in direct contact with a top surface of the first connecting semiconductor pattern.

In some exemplary embodiments of the present inventive concept, a bottom surface of the second vertical semiconductor pattern may be at a higher level than an uppermost one of the lower gate electrodes.

In some exemplary embodiments of the present inventive concept, the semiconductor device may include an upper vertical insulator disposed between the upper stack structure and the upper channel structure. A sidewall of the upper vertical insulator need not overlap with a sidewall of the lower vertical insulator in a cross-sectional view.

In some exemplary embodiments of the present inventive concept, the first connecting semiconductor pattern may include a protrusion vertically extending toward a lower portion of the upper stack structure. The protrusion may be in direct contact with a bottom portion of the second vertical semiconductor pattern.

In some exemplary embodiments of the present inventive concept, a bottom surface of the upper vertical insulator may be in direct contact with a top surface of the protrusion.

In some exemplary embodiments of the present inventive concept, the protrusion may be disposed between the lower vertical insulator and the upper vertical insulator.

In some exemplary embodiments of the present inventive concept, a top surface of the protrusion may be lower than a bottom surface of a lowermost one of the upper gate electrodes.

According to an exemplary embodiment of the present inventive concept, a method of manufacturing a semiconductor device includes forming a lower thin-layer structure including lower sacrificial layers and lower insulating layers that are alternately and repeatedly stacked on a substrate. A lower channel hole that penetrates the lower thin-layer structure to expose the substrate is formed. A lower channel structure is formed in the lower channel hole. The lower channel structure includes a first vertical semiconductor pattern and a first connecting semiconductor pattern disposed on the first vertical semiconductor pattern. An upper thin-layer structure is formed on the lower thin-layer structure. The upper thin-layer structure includes upper sacrificial layers and upper insulating layers that are alternately and repeatedly stacked. An upper channel hole is formed that penetrates the upper thin-layer structure and an upper portion of the lower thin-layer structure to expose an inner surface of the first connecting semiconductor pattern. The exposed inner surface of the first connecting semiconductor pattern is etched to form a recessed hole between the first connecting semiconductor pattern and the upper thin-layer structure. An upper channel structure is formed in the recessed hole and the upper channel hole. The upper channel structure is in direct contact with the first connecting semiconductor pattern.

In some exemplary embodiments of the present inventive concept, forming the upper channel structure may include forming an upper vertical insulating layer in the recessed hole and the upper channel hole. A semiconductor layer covering the upper vertical insulating layer may be formed. The semiconductor layer and the upper vertical insulating layer disposed on a bottom surface of the recessed hole may be etched to expose a top surface of the first connecting semiconductor pattern. A second vertical semiconductor pattern may be formed on the exposed top surface of the first connecting semiconductor pattern.

According to an exemplary embodiment of the present inventive concept, a method of manufacturing a semiconductor device includes forming a lower thin-layer structure including lower sacrificial layers and lower insulating layers that are alternately and repeatedly stacked on a substrate. A lower channel hole that penetrates the lower thin-layer structure to expose the substrate is formed. A lower channel structure is formed in the lower channel hole. The lower channel structure includes a first vertical semiconductor pattern and a first connecting semiconductor pattern disposed on the first vertical semiconductor pattern. An upper thin-layer structure is formed on the lower thin-layer structure. The upper thin-layer structure includes upper sacrificial layers and upper insulating layers that are alternately and repeatedly stacked. An upper channel hole is formed that penetrates the upper thin-layer structure and an upper portion of the lower thin-layer structure to expose an inner surface of the first connecting semiconductor pattern. A selective epitaxial growth (SEG) process is performed on the exposed inner surface of the first connecting semiconductor pattern to form a protrusion vertically extending along the upper channel hole. An upper channel structure is formed. The upper channel structure is in contact with the protrusion in the upper channel hole.

In some exemplary embodiments of the present inventive concept, an outer sidewall of the protrusion may be in direct contact with an inner sidewall of a lower portion of the upper channel hole.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION OF THE EMBODIMENTS

Figure 1:
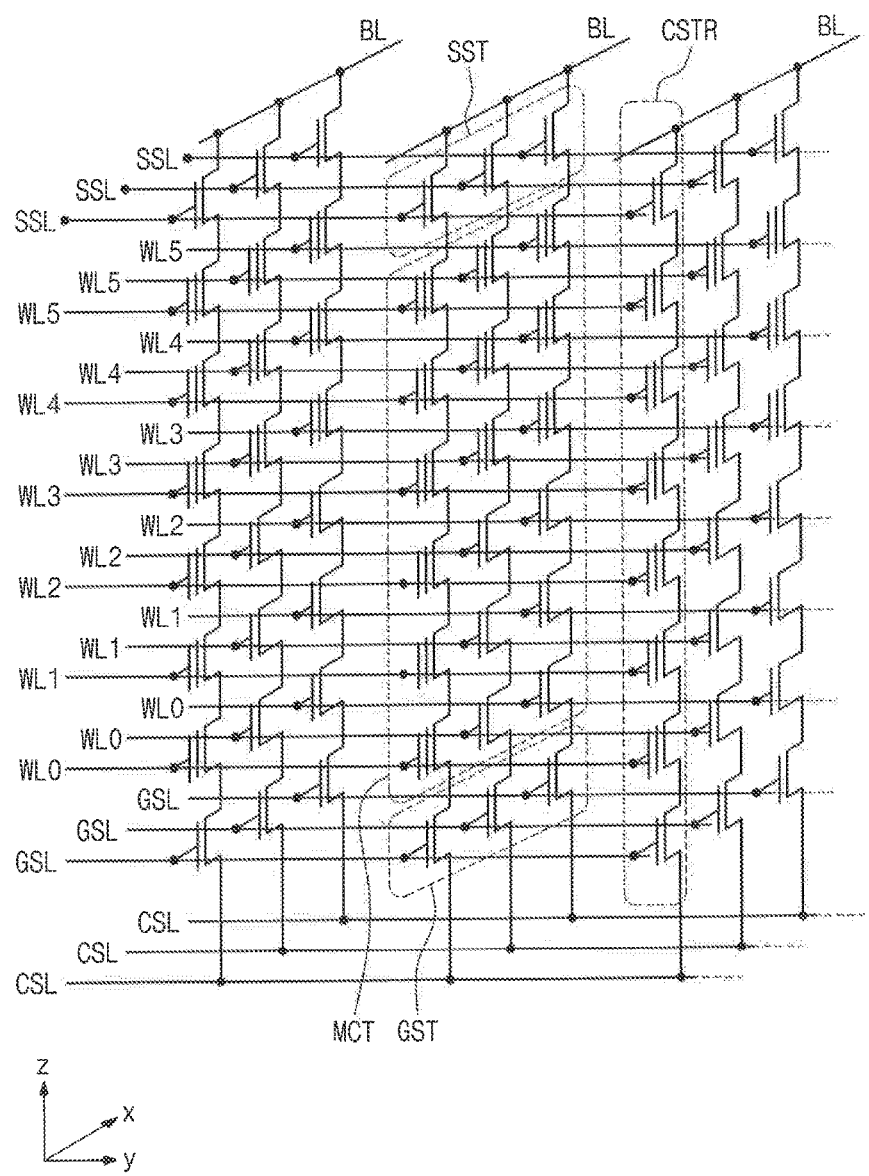
FIG. 1 is a schematic circuit diagram illustrating a cell array of a 3D semiconductor memory device according to some exemplary embodiments of the present inventive concept.

Exemplary embodiments of the present inventive concept will now be described more fully hereinafter with reference to the accompanying drawings, in which exemplary embodiments of the present inventive concept are shown. Aspects and features of the present inventive concept and methods of achieving them will be apparent from the following exemplary embodiments that will be described in more detail with reference to the accompanying drawings. It should be noted, however, that the present inventive concept is not limited to the following exemplary embodiments, and may be implemented in various forms. In the drawings, exemplary embodiments of the present inventive concept are not limited to the specific examples provided herein, which may be exaggerated for clarity.

The terminology used herein is for the purpose of describing particular embodiments only and is not intended to limit the exemplary embodiments of the present inventive concept. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

Exemplary embodiments of the present inventive concept are not limited to the specific shape illustrated in the exemplary views, but may include other shapes that may be created according to manufacturing processes. Thus, this should not be construed as limited to the scope of the present inventive concept.

The same reference numerals or the same reference designators may denote the same elements throughout the specification and drawings.

Exemplary embodiments of the present inventive concept should not be construed as limited to the shapes of regions illustrated herein but are to include deviations in shapes that result, for example, from manufacturing. For example, an etching region illustrated as a rectangle may have rounded or curved features.

Devices and methods of forming devices according to exemplary embodiments of the present inventive concept described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to exemplary embodiments of the present inventive concept described herein may include a plurality of the devices in an array and/or in a two-dimensional pattern that is based on the functionality of the microelectronic device.

The devices according to exemplary embodiments of the present inventive concept described herein may be interspersed among other devices depending on the functionality of the microelectronic device. Moreover, microelectronic devices according to various exemplary embodiments of the present inventive concept described herein may be replicated in a third direction that may be orthogonal to the two different directions, to provide three-dimensional integrated circuits.

When a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic circuit diagram illustrating a cell array of a three-dimensional (3D) semiconductor memory device according to some exemplary embodiments of the present inventive concept.

Referring to FIG. 1, a cell array of a 3D semiconductor memory device according to some exemplary embodiments of the present inventive concept may include a common source line CSL, a plurality of bit lines BL, and a plurality of cell strings CSTR disposed between the common source line CSL and the bit lines BL.

The common source line CSL may include a conductive layer disposed on a substrate or a dopant region disposed in the substrate. The bit lines BL may include conductive patterns (e.g., metal lines) that are spaced apart from the substrate and are disposed over the substrate. The bit lines BL may be two-dimensionally arranged and a plurality of the cell strings CSTR may be connected in parallel to each of the bit lines BL. The cell strings CSTR may be connected in common to the common source line CSL. A plurality of the cell strings CSTR may be disposed between the common source line CSL and the plurality of bit lines BL. According to an exemplary embodiment of the present inventive concept, a plurality of common source lines CSL may be provided, and the plurality of common source lines CSL may be two-dimensionally disposed. A same voltage may be applied to each of the common source lines CSL. Alternatively, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT disposed between the ground selection transistors GST and the string selection transistors SST. The ground selection transistors GST, the memory cell transistors MCT, and the string selection transistor SST may be connected in series to each other.

The common source line CSL may be connected in common to sources of the ground selection transistors GST of the cell strings CSTR. A ground selection line GSL, a plurality of gate electrodes WL0 to WL5, and a string selection line SSL, which may be disposed between the common source line CSL and the bit lines BL, may be used as gate electrodes of the ground selection transistor GST, the memory cell transistors MCT, and the string selection transistor SST, respectively. Each of the memory cell transistors MCT may include a data storage element.

Figure 2A:
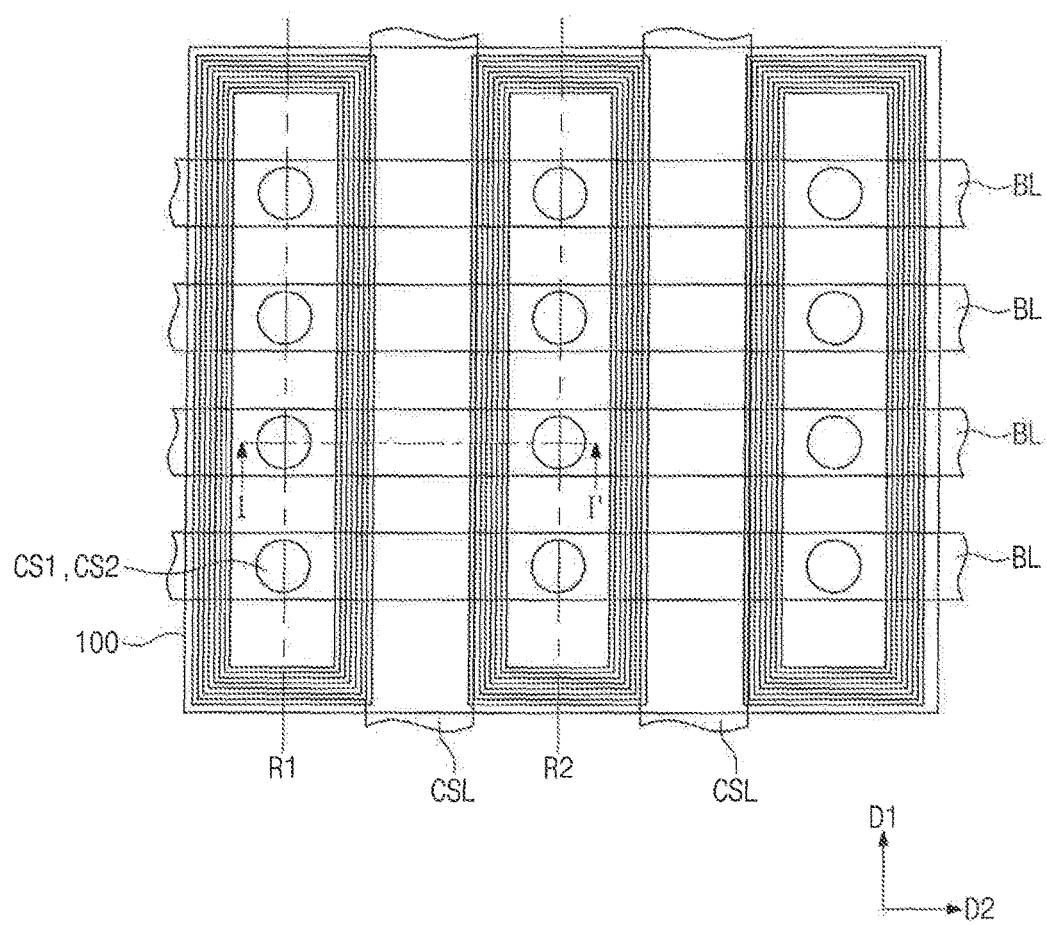
FIG. 2A is a plan view illustrating a 3D semiconductor memory device according to some exemplary embodiments of the present inventive concept.
Figure 2B:
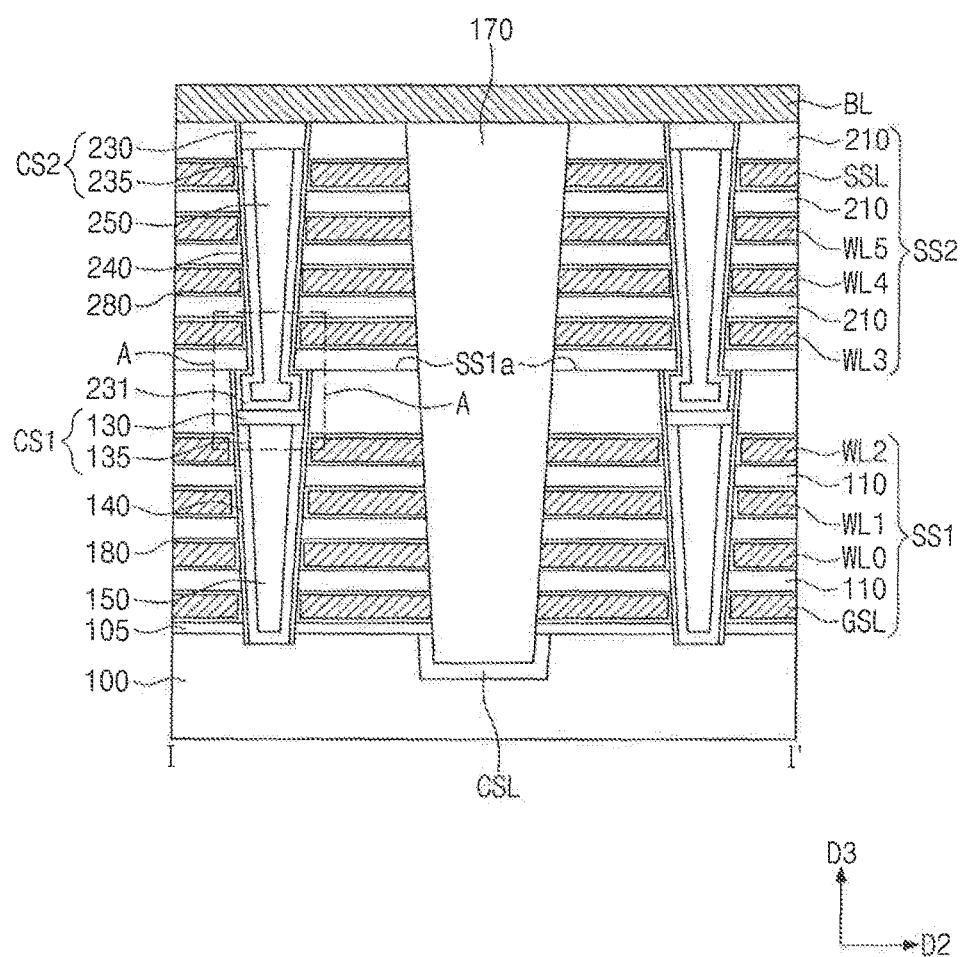
FIG. 2B is a cross-sectional view taken along line I-I' of FIG. 2A.

FIG. 2A is a plan view illustrating a 3D semiconductor memory device according to some exemplary embodiments of the present inventive concept. FIG. 2B is a cross-sectional view taken along line I-I' of FIG. 2A.

Referring to FIGS. 2A and 2B, a substrate 100 may be a silicon substrate, a germanium substrate, or a silicon-germanium substrate. The substrate 100 may include common source lines CSL that are doped with dopants. For example, the common source lines CSL may be regions doped with N-type dopants. Each of the common source lines CSL may overlap an electrode isolation pattern 170. The common source lines CSL may have line shapes that extend in a first direction D1 parallel to a top surface of the substrate 100. The common source lines CSL may be disposed along a second direction D2 intersecting the first direction D1.

A lower stack structure SS1 may be disposed on the substrate 100. The lower stack structure SS1 may include lower gate electrodes GSL and WL0 to WL2 and lower insulating layers 110 that are alternately and repeatedly stacked on the substrate 100. The lower gate electrodes GSL and WL0 to WL2 included in the lower stack structure SS1 may be stacked along a third direction D3 perpendicular to the first and second directions D1 and D2. The lower gate electrodes GSL and WL0 to WL2 may be separated from each other by the lower insulating layers 110 disposed therebetween. Each of the lower insulating layers 110 may include, for example, a silicon oxide layer. Each of the lower gate electrodes GSL and WL0 to WL2 may include at least one of doped silicon, tungsten, a metal nitride, or a metal silicide. When viewed from a plan view, the lower stack structure SS1 may have a line shape extending in the first direction D1. A lowermost insulating layer 105 may be disposed between the substrate 100 and the lower stack structure SS1. The lowermost insulating layer 105 may include, for example, a silicon oxide layer. The lowermost insulating layer 105 may be thinner than the lower insulating layers 110.

A plurality of lower channel structures CS1 may penetrate the lower stack structure SS1 so as to be electrically connected to the substrate 100. The lower channel structures CS1 may be spaced apart from each other and may be disposed in the first direction D1. A plurality of lower stack structure SS1 may be disposed on the substrate 100, and the plurality of lower stack structures SS1 may be laterally spaced apart from each other. The common source line CSL may be disposed in the substrate 100 between the lower stack structures SS1 adjacent to each other. The lower channel structures CS1 penetrating the lower stack structures SS1 may include a first column R1 and a second column R2 that are parallel to the first direction D1. The first column R1 and the second column R2 may be spaced apart from each other in the second direction D2. The lower channel structures CS1 may be disposed in a matrix form along the first and second directions D1 and D2. Alternatively, the lower channel structures CS1 penetrating each of the lower stack structures SS1 may be disposed in a zigzag form along the first direction D1.

An upper stack structure SS2 may be disposed on an uppermost lower insulating layer 110. The upper stack structure SS2 may include upper gate electrodes WL3 to WL5 and SSL and upper insulating layers 210 that are alternately and repeatedly stacked. The upper gate electrodes WL3 to WL5 and SSL included in the upper stack structure SS2 may be stacked along the third direction D3. The upper gate electrodes WL3 to WL5 and SSL may be separated from each other by the upper insulating layers 210 disposed therebetween. Each of the upper insulating layers 210 may include, for example, a silicon oxide layer. Each of the upper gate electrodes WL3 to WL5 and SSL may include at least one of doped silicon, tungsten, a metal nitride, or a metal silicide. When viewed from a plan view, the upper stack structure SS2 may overlap the lower stack structure SS1 and may have a line shape extending in the first direction D1. A plurality of the upper stack structures SS2 may be disposed on the plurality of lower stack structures SS1, respectively.

According to some exemplary embodiments of the present inventive concept, a lowermost lower gate electrode GSL may be used as the gate electrode of the ground selection transistor GST described with reference to FIG. 1. An uppermost upper gate electrode SSL may be used as the gate electrode of the string selection transistor SST described with reference to FIG. 1. The gate electrodes WL0 to WL5 disposed between the uppermost upper gate electrode SSL and the lowermost lower gate electrode GSL may be used as the gate electrodes of the memory cell transistors MCT.

A plurality of upper channel structures CS2 may penetrate each of the upper stack structures SS2 so as to be electrically connected to the lower channel structures CS1, respectively. The connections between the lower and upper channel structures CS1 and CS2 will be described in more detail below. As illustrated in FIG. 2A, the upper channel structures CS2 may be spaced apart from each other and may be disposed in the first direction D1. The upper channel structures CS2 may include the first column R1 and the second column R2 in the first direction D1. The first and second columns R1 and R2 may be spaced apart from each other in the second direction. The upper channel structures CS2 may be disposed in a matrix form along the first and second directions D1 and D2. Alternatively, the upper channel structures CS2 may be disposed in a zigzag form in the first direction D1. The upper channel structures CS2 may overlap the lower channel structures CS1 when viewed from a plan view.

Each of the lower channel structures CS1 may penetrate the lower stack structure SS1 so as to be electrically connected to the substrate 100. Each of the lower channel structures CS may include a first vertical semiconductor pattern 135 connected to the substrate 100, and a first connecting semiconductor pattern 130 disposed on the first vertical semiconductor pattern 135. According to an exemplary embodiment of the present inventive concept, a sidewall of the first vertical semiconductor pattern 135 may be inclined. The first vertical semiconductor pattern 135 may have a cup shape of which a top end is opened. The first connecting semiconductor pattern 130 may extend from a top surface of the first vertical semiconductor pattern 135 in the third direction D3. The first connecting semiconductor pattern 130 may have a cover shape that covers the opened top end of the first vertical semiconductor pattern 135. A top surface of the first connecting semiconductor pattern 130 may be a planarized surface. An inside of each of the lower channel structures CS1 may be filled with a lower filling insulation layer 150. A top surface of the lower filling insulation layer 150 may be coplanar with the top surface of the first vertical semiconductor pattern 135.

Each of the upper channel structures CS2 may sequentially penetrate the upper stack structure SS2 and an upper portion of the lower stack structure SS1. Each of the upper channel structures CS2 may include a second vertical semiconductor pattern 235 connected to the first connecting semiconductor pattern 130, and a second connecting semiconductor pattern 230 disposed on the second vertical semiconductor pattern 235. According to an exemplary embodiment of the present inventive concept, a sidewall of the second vertical semiconductor pattern 235 may be inclined. The second vertical semiconductor pattern 235 may have a cup shape of which a top end is opened. An outer sidewall of the second vertical semiconductor pattern 235 may have a stepped profile at a contact portion of the lower stack structure SS1 and the upper stack structure SS2. An outer diameter of the second vertical semiconductor pattern 235 may be gradually reduced along a direction opposite to the third direction D3 and may be discontinuously increased at the contact portion of the lower and upper stack structures SS1 and SS2. The second connecting semiconductor pattern 230 may extend from a top surface of the second vertical semiconductor pattern 235 in the third direction D3. The second connecting semiconductor pattern 230 may have a cover shape that covers the opened top end of the second vertical semiconductor pattern 235. A top surface of the second connecting semiconductor pattern 230 may be a planarized surface. An inside of each of the upper channel structures CS2 may be filled with an upper filling insulation layer 250. A top surface of the upper filling insulation layer 250 may be coplanar with the top surface of the second vertical semiconductor pattern 235.

Each of the lower and upper channel structures CS1 and CS2 may include a semiconductor material. For example, each of the lower and upper channel structures CS1 and CS2 may include an intrinsic semiconductor layer that is not doped with dopants. The intrinsic semiconductor layer may include silicon (Si), germanium (Ge), or a mixture thereof. Each of the lower and upper channel structures CS1 and CS2 may include a semiconductor material doped with dopants. The lower and upper channel structures CS1 and CS2 may be doped with dopants of which a conductivity type is the same as that of dopants of the substrate 100. The lower and upper channel structures CS1 and CS2 may have at least one of a single-crystalline structure, an amorphous structure, or a poly-crystalline structure. For example, the first connecting semiconductor pattern 130 may be doped with N-type dopants. A concentration of the N-type dopants of the first connecting semiconductor pattern 130 may be in a range of from about $10^{-19}/cm^3$ to about $10^{-17}/cm^3$. If the concentration of the N-type dopants is higher than $10^{-7}/cm^3$, it may be difficult to realize a smooth hole path.

If a voltage is applied to one of the lower and upper gate electrodes GSL, WL0 to WL5, and SSL, a channel may be generated in the lower and/or upper channel structure CS1 or CS2 adjacent thereto. Inversion regions may also be generated under and on the channel by a fringe field caused by the voltage. The inversion regions may act as source/drain regions of each of the ground selection transistor GST, the memory cell transistor MCT, and/or the string selection transistor SST.

A lower vertical insulator 140 may be disposed between the lower stack structure SS1 and each of the lower channel structures CS1. The lower vertical insulator 140 may have a pipe or a cylindrical shape. A top end and a bottom end of the lower vertical insulator 140 may be open. In some exemplary embodiments of the present inventive concept, the lower vertical insulator 140 may be in contact with the substrate 100. The lower vertical insulator 140 may cover an inner sidewall of the lower stack structure SS1.

An upper vertical insulator 240 may be disposed between the upper stack structure SS2 and each of the upper channel structures CS2. The upper vertical insulator 240 may have a pipe or a cylindrical shape. A top end and a bottom end of the upper vertical insulator 240 may be open. An outer sidewall of the upper vertical insulator 240 may have a stepped profile at the contact portion of the lower and upper stack structures SS1 and SS2. In some exemplary embodiments of the present inventive concept, the upper vertical insulator 240 may be in contact with the first connecting semiconductor pattern 130. The upper vertical insulator 240 may cover an inner sidewall of the upper stack structure SS2. The structures of the lower and upper vertical insulators 140 and 240 will be described in more detail below.

The lower and upper vertical insulators 140 and 240 may include memory elements of a flash memory device. Each of the lower and upper vertical insulators 140 and 240 may include a charge storage layer (not shown) of the flash memory device. Alternatively, each of the lower and upper vertical insulators 140 and 240 may include another thin layer capable of storing data, for example, a thin layer for a phase change memory device or a thin layer for a variable resistance memory device. In some exemplary embodiments of the present inventive concept, each of the lower and upper vertical insulators 140 and 240 may include the charge storage layer (not shown) and a tunnel dielectric layer (not shown) that are sequentially stacked. In some exemplary embodiments of the present inventive concept, each of the lower and upper vertical insulators 140 and 240 may include a blocking dielectric layer (not shown) that is disposed between the charge storage layer (not shown) and the gate electrodes GSL, WL0 to WL5, and SSL. In some exemplary embodiments of the present inventive concept, the lower vertical insulator 140 may include a capping layer (not shown) disposed between the lower channel structure CS1 and the lower insulating layers 110, and the upper vertical insulator 240 may include a capping layer (not shown) disposed between the upper channel structure CS2 and the upper insulating layers 210.

The charge storage layer may include at least one of a silicon nitride layer, a silicon oxynitride layer, a silicon-rich nitride layer, a nano-crystalline silicon layer, or a laminated trap layer. The tunnel dielectric layer may include a material of which an energy band gap is greater than that of the charge storage layer. For example, the tunnel dielectric layer may include a silicon oxide layer. The blocking dielectric layer may include a material of which an energy band gap is greater than that of the charge storage layer. For example, the blocking dielectric layer may include at least one of a silicon oxide layer, a silicon nitride layer, or a silicon oxynitride layer. The capping layer may include at least one of a silicon layer, a silicon oxide layer, a poly-silicon layer, a silicon carbide layer, or a silicon nitride layer. The capping layer may include a material different from those of the lower and upper insulating layers 110 and 210. In some exemplary embodiments of the present inventive concept, the capping layer may include at least one of high-k dielectric layers such as a tantalum oxide ($Ta_2O_5$) layer, a titanium oxide ($TiO_2$) layer, a hafnium oxide ($HfO_2$) layer, or a zirconium oxide ($ZrO_2$) layer.

Lower horizontal insulators 180 that cover top surfaces and bottom surfaces of the lower gate electrodes GSL and WL0 to WL2 may be disposed between the lower gate electrodes GSL and WL0 to WL2 and the lower insulating layers 110. The lower horizontal insulators 180 may also be disposed between the lower channel structure CS1 and the lower gate electrodes GSL and WL0 to WL2. In some exemplary embodiments of the present inventive concept, the lower vertical insulator 140 may be disposed between the lower channel structure CS1 and the lower horizontal insulators 180.

Upper horizontal insulators 280 that cover top surfaces and bottom surfaces of the upper gate electrodes WL3 to WL5 and SSL may be disposed between the upper gate electrodes WL3 to WL5 and SSL and the upper insulating layers 210. The upper horizontal insulators 280 may also be disposed between the upper channel structure CS2 and the upper gate electrodes WL3 to WL5 and SSL. In some exemplary embodiments of the present inventive concept, the upper vertical insulator 240 may be disposed between the upper channel structure CS2 and the upper horizontal insulators 280.

Each of the lower and upper horizontal insulators 180 and 280 may include a single layer or a plurality of layers. In some exemplary embodiments of the present inventive concept, each of the lower and upper horizontal insulators 180 and 280 may include a blocking dielectric layer (not shown) of a charge trap-type flash memory transistor. In some exemplary embodiments of the present inventive concept, each of the lower and upper horizontal insulators 180 and 280 may include a plurality of blocking dielectric layers (not shown). In some exemplary embodiments of the present inventive concept, each of the lower and upper horizontal insulators 180 and 280 may include a charge storage layer (not shown) and a blocking dielectric layer (not shown) of the charge trap-type flash memory transistor. For example, the blocking dielectric layer of each of the lower and upper horizontal insulators 180 and 280 may include a high-k dielectric layer of which a dielectric constant is greater than that of the tunnel dielectric layer.

The uppermost upper gate electrodes SSL that are laterally adjacent to each other may be separated from each other by the electrode isolation pattern 170 extending in the first direction D1. The electrode isolation pattern 170 may be disposed between adjacent lower stack structures SS1 and between adjacent upper stack structures SS2. The electrode isolation pattern 170 may be in contact with the substrate 100.

Bit lines BL may be disposed on the upper stack structure SS2 and may cross over the upper stack structure SS2. The bit lines BL may extend in the second direction D2. The bit lines may be spaced apart from each other and may be disposed in the first direction D1. The bit lines BL may be connected to the second connecting semiconductor patterns 230.

Figure 2C:
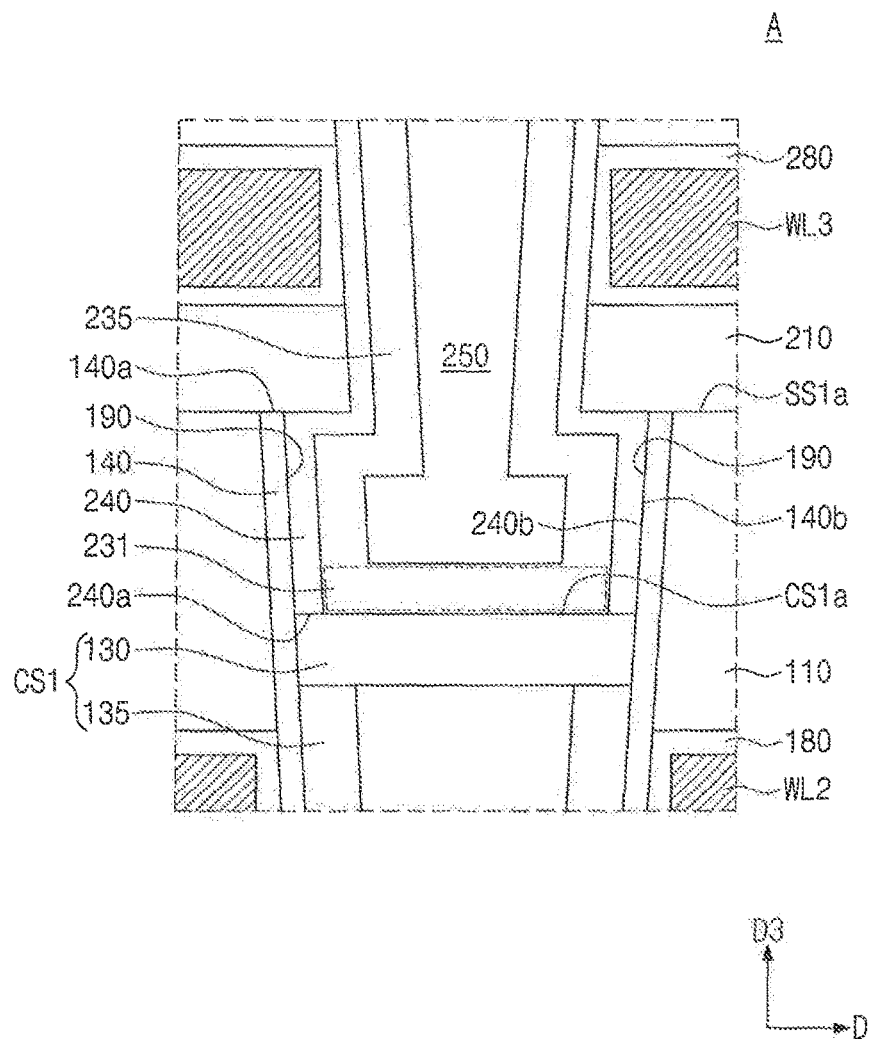
FIG. 2C is an enlarged view of a portion 'A' of FIG. 2B.

FIG. 2C is an enlarged view of a portion 'A' of FIG. 2B.

Referring to FIGS. 2B and 2C, the lower and upper channel structures CS1 and CS2 and the lower and upper vertical insulators 140 and 240 will be described in more detail hereinafter.

The second vertical semiconductor pattern 235 may be in direct contact with the first connecting semiconductor pattern 130. Thus, the second vertical semiconductor pattern 235 may be electrically connected to the first vertical semiconductor pattern 135 with the first connecting semiconductor pattern 130 disposed therebetween.

A top surface 140a of the lower vertical insulator 140 may be coplanar with a top surface 551a of the lower stack structure SS1. The top surface SS1a of the lower stack structure SS1 may be a top surface of the uppermost lower insulating layer 110. A bottom surface 240a of the upper vertical insulator 240 may be coplanar with the top surface of the first connecting semiconductor pattern 130. The bottom surface 240a of the upper vertical insulator 240 may be in contact with the top surface of the first connecting semiconductor pattern 130. An inner sidewall 140b of an upper portion of the lower vertical insulator 140 may be in direct contact with an outer sidewall 240b of a lower portion of the upper vertical insulator 240.

A topmost surface CS1a of the lower channel structure CS1 may be disposed at a different level from the top surface 140a of the lower vertical insulator 140. In an exemplary embodiment of the present inventive concept, the topmost surface CS1a of the lower channel structure CS1 may be the top surface of the first connecting semiconductor pattern 130. The top surface of the first connecting semiconductor pattern 130 may be lower than the top surface 140a of the lower vertical insulator 140.

A recessed hole 190 may be disposed between the first connecting semiconductor pattern 130 and the upper stack structure SS2. The recessed hole 190 may be a region that is surrounded by a bottom surface of the lowermost upper insulating layer 210, the inner sidewall 140b of the upper portion of the lower vertical insulator 140, and the top surface of the first connecting semiconductor pattern 130. The second vertical semiconductor pattern 235 may include a bottom portion 231 that is disposed between a bottom surface of the upper filling insulation layer 250 and a bottom surface of the second vertical semiconductor pattern 235.

The lower portion of the upper vertical insulator 240 and a lower portion of the second vertical semiconductor pattern 235 may be disposed in the recessed hole 190. The bottom portion 231 may be disposed in a lower region of the recessed hole 190. Thus, the bottom portion 231 may be in direct contact with the top surface of the first connecting semiconductor pattern 130. The second vertical semiconductor pattern 235 may be disposed in the upper portion of the lower stack structure SS1 as well as in the upper stack structure SS2. The bottom surface of the second vertical semiconductor pattern 235 may be higher than the uppermost lower gate electrode WL2. The second vertical semiconductor pattern 235 disposed in the recessed hole 190 need not laterally overlap with the lower channel structure CS1. The first vertical semiconductor pattern 135, the first connecting semiconductor pattern 130, and the second vertical semiconductor pattern 235 may be vertically stacked but need not be laterally disposed.

If a protruding upper portion of the lower channel structure CS1 is laterally adjacent to the upper channel structure CS2 with the upper vertical insulator 240 disposed therebetween in a connecting region of the lower and upper channel structures CS1 and CS2, a screen effect may occur. The protruding upper portion of the lower channel structure CS1 may block the fringe field and may disturb the formation of the inversion region in the upper channel structure CS2 adjacent to the protruding upper portion. Thus, it may be difficult to secure a path through which electrons and/or holes smoothly pass.

However, in the 3D semiconductor memory device according to an exemplary embodiment of the present inventive concept, the upper channel structure CS2 may be vertically stacked on the lower channel structure CS1 but need not laterally overlap with the lower channel structure CS1. Since the upper channel structure CS2 is not screened by the lower channel structure CS1, it is possible to reduce or prevent the problem caused by the screen effect.

FIGS. 3A, 3B, 3C, 3D, 3E, 3F, 3G, 3H, 3I and 3J are cross-sectional views illustrating a method of manufacturing a 3D semiconductor memory device according to some exemplary embodiments of the present inventive concept. FIGS. 3A to 3J are cross-sectional views corresponding to the line I-I' of FIG. 2A.

Figure 3A:
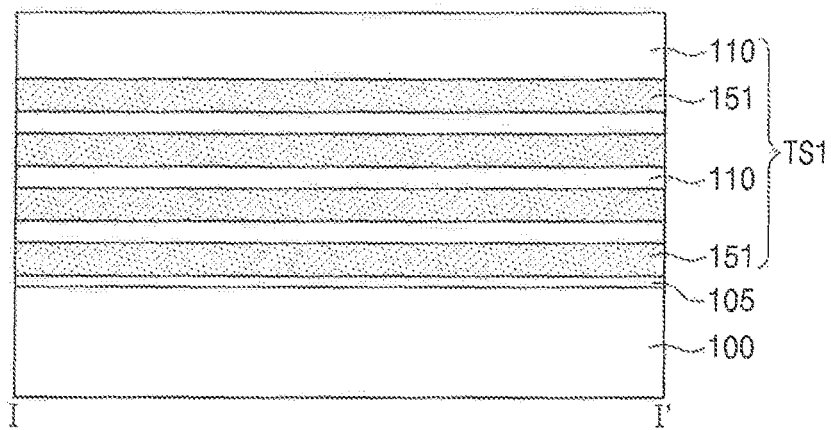
FIGS. 3A, 3B, 3C, 3D, 3E, 3F, 3G, 3H, 3I and 3J are cross-sectional views illustrating a method of manufacturing a 3D semiconductor memory device according to some exemplary embodiments of the present inventive concept.
Figure 3A:
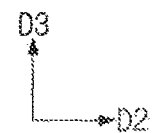

Referring to FIGS. 2A and 3A, lower sacrificial layers 151 and lower insulating layers 1100 may be alternately and repeatedly stacked on the substrate 100 to form a lower thin-layer structure TS1. The substrate 100 may be, for example, a silicon substrate, a germanium substrate, or a silicon-germanium substrate.

The lower sacrificial layers 151 may include a material having an etch selectivity with respect to the lower insulating layers 110. In some exemplary embodiments of the present inventive concept, a difference between an etch rate of the sacrificial layers 151 and an etch rate of the lower insulating layers 110 may be relatively high in a wet etching process using a chemical solution but may be relatively low in a dry etching process using an etching gas.

In some exemplary embodiments of the present inventive concept, each of the lower sacrificial layers 151 may be the same thickness as each other. Alternatively, a lowermost one of the lower sacrificial layers 151 may be thicker than others of the lower sacrificial layers 151. The lower insulating layers 110 may be the same thickness. Alternatively, a thickness of at least one of the lower insulating layers 110 may be different from those of others of the lower insulating layers 110.

For example, each of the lower sacrificial layers 151 and the lower insulating layers 110 may be deposited using a thermal chemical vapor deposition (thermal CVD) process, a plasma-enhanced CVD process, a physical CVD process, or an atomic layer deposition (ALD) process.

According to some exemplary embodiments of the present inventive concept, the lower sacrificial layers 151 and the lower insulating layers 110 may include insulating materials and may have an etch selectivity with respect to each other. For example, each of the lower sacrificial layers 151 may include at least one of a silicon layer, a silicon oxide layer, a silicon carbide layer, a silicon oxynitride layer, or a silicon nitride layer. Each of the lower insulating layers 110 may include at least one of a silicon layer, a silicon oxide layer, a silicon carbide layer, a silicon oxynitride layer, or a silicon nitride layer, and the material of the lower insulating layer 110 may be different from that of the lower sacrificial layer 151. In some exemplary embodiments of the present inventive concept, each of the lower sacrificial layers 151 may include the silicon nitride layer, and each of the lower insulating layers 110 may include the silicon oxide layer. In some exemplary embodiments of the present inventive concept, the lower sacrificial layers 151 may include a conductive material, and the lower insulating layers 110 may include an insulating material.

A lowermost insulating layer 105 may be disposed between the substrate 100 and the lower thin-layer structure TS1. For example, the lowermost insulating layer 105 may be a silicon oxide layer that is formed by a thermal oxidation process. Alternatively, the lowermost insulating layer 105 may be a silicon oxide layer that is formed using a deposition technique. The lowermost insulating layer 105 may be thinner than the lower sacrificial layers 151 and the lower insulating layers 110 which are formed thereon.

Figure 3B:
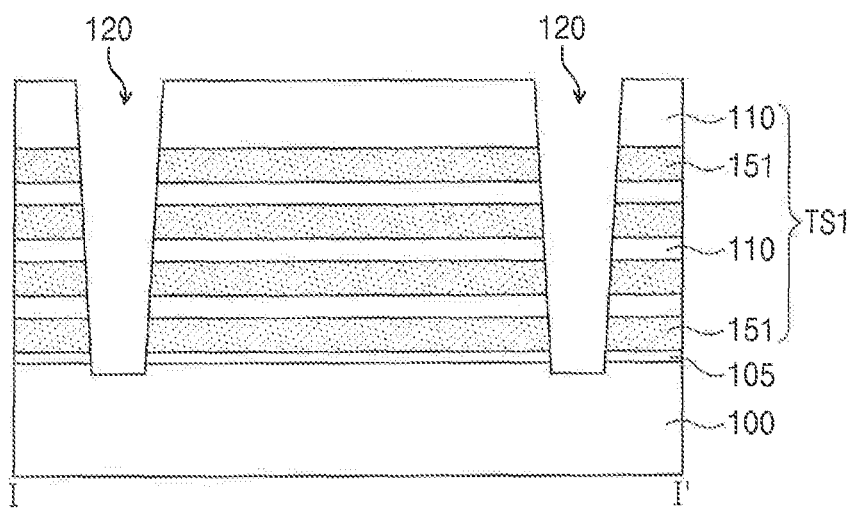

Referring to FIGS. 2A and 3B, lower channel holes 120 may penetrate the lower thin-layer structure TS1. The lower channel holes 120 may expose the substrate 100. When viewed from a plan view, the lower channel holes 120 may be spaced apart from each other and may be disposed along the first direction D1. The lower channel holes 120 may include the first column R1 and the second column R2 that may be parallel to the first direction D1. The first column R1 and the second column R2 may be spaced apart from each other in the second direction D2 intersecting the first direction D1. The lower channel holes 120 may be disposed in a matrix form along the first and second directions D1 and D2. Alternatively, the lower channel holes 120 may be arranged in a zigzag form.

Forming the lower channel holes 120 may include forming a first mask pattern (not shown) having openings defining the lower channel holes 120 on the lower thin-layer structure TS1, and etching the lower thin-layer structure TS1 using the first mask pattern as an etch mask. The first mask pattern may include a material having an etch selectivity with respect to the lower sacrificial layers 151 and the lower insulating layers 110. The top surface of the substrate 100, which may be disposed under the lower channel holes 120, may be over-etched during the etching process of the lower thin-layer structure TS1. Thus, the top surface of the substrate 100 may be recessed. Sidewalls of the lower channel holes 120 may be inclined by by-products generated during the etching process. A width of an upper portion of the lower channel hole 120 may be greater than that of a lower portion of the lower channel hole 120.

Figure 3C:
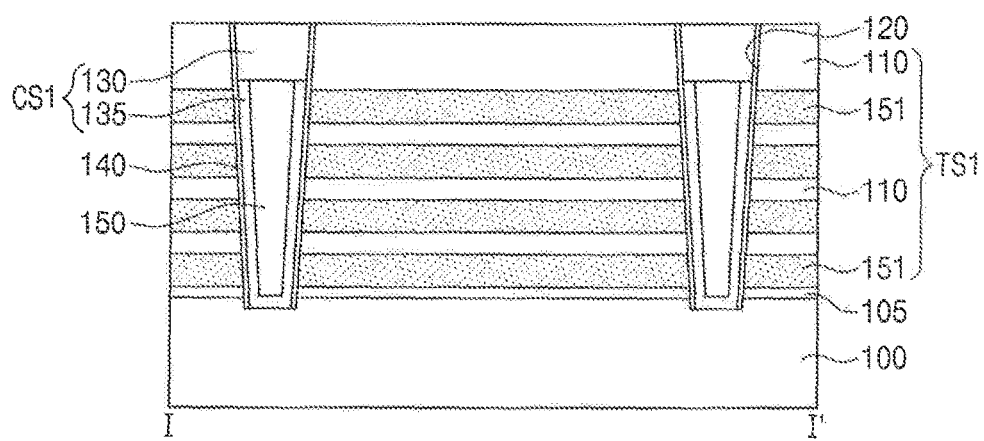
Figure 3C:
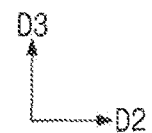

Referring to FIGS. 2A and 3C, lower channel structures CS1 may be formed in the lower channel holes 120, respectively. Each of the lower channel structures CS1 may include the first vertical semiconductor pattern 135 and the first connecting semiconductor pattern 130 disposed on the first vertical semiconductor pattern 135.

The lower vertical insulator 140 and the first vertical semiconductor pattern 135 may be formed to cover an inner sidewall of each of the lower channel holes 120. The lower vertical insulator 140 and the first vertical semiconductor pattern 135 may expose the substrate 100. A lower vertical insulating layer (not shown) and a first lower semiconductor layer (not shown) may be sequentially formed on the substrate 100 having the lower channel holes 120. The lower vertical insulating layer (not shown) and the first lower semiconductor layer (not shown) may partially fill the lower channel holes 120. The lower channel holes 120 need not be completely filled with the lower vertical insulating layer (not shown) and the first lower semiconductor layer (not shown). The lower vertical insulating layer (not shown) may cover the top surface, which may be exposed by the lower channel holes 120, of the substrate 100. The lower vertical insulating layer (not shown) may be formed of a plurality of thin layers. For example, the lower vertical insulating layer may be deposited using at least one of a plasma-enhanced CVD technique, a physical CVD technique, or an ALD technique. The lower vertical insulating layer (not shown) may include a charge storage layer used as a memory element of a flash memory device. In some exemplary embodiments of the present inventive concept, the charge storage layer may be a trap insulating layer or an insulating layer including conductive nano dots. The lower vertical insulating layer (not shown) may include a thin layer for a phase change memory or a thin layer for a variable resistance memory.

In some exemplary embodiments of the present inventive concept, even though not shown in the drawings, the lower vertical insulating layer (not shown) may include a blocking dielectric layer, the charge storage layer, and a tunnel dielectric layer that are sequentially stacked. The blocking dielectric layer may cover sidewalls of the lower sacrificial layers 151 and the lower insulating layers 110 and the top surface of the substrate 100 that may be exposed by the lower channel holes 120. The blocking dielectric layer may include, for example, a silicon oxide layer. The charge storage layer may include the trap insulating layer or the insulating layer including the conductive nano dots. For example, the charge storage layer may include at least one of a silicon nitride layer, a silicon oxynitride layer, a silicon-rich nitride layer, a nano-crystalline silicon layer, or a laminated trap layer. The tunnel dielectric layer may include at least one of materials of which energy band gaps are greater than that of the charge storage layer. For example, the tunnel dielectric layer may be a silicon oxide layer.

The first lower semiconductor layer (not shown) may be formed on the lower vertical insulating layer (not shown). In some exemplary embodiments of the present inventive concept, the first lower semiconductor layer (not shown) may be a semiconductor material layer (e.g., a poly-crystalline silicon layer, a single-crystalline silicon layer, or an amorphous silicon layer) that is formed using one of an ALD technique or a CVD technique.

The lower vertical insulating layer (not shown) and the first lower semiconductor layer (not shown) may be anisotropically etched to expose the substrate 100. Thus, the lower vertical insulator 140 and a first lower semiconductor pattern (not shown) may be formed on the inner sidewall of each of the lower channel holes 120. Each of the lower vertical insulator 140 and the first lower semiconductor pattern (not shown) may have a hollow cylindrical shape of which both ends are open. The top surface of the lower thin-layer structure TS1 may be exposed by the anisotropic etching process.

A second lower semiconductor layer may be deposited on the substrate 100. The second lower semiconductor layer may electrically connect the first semiconductor pattern to the substrate 100 disposed under the lower channel hole 120. For example, the second lower semiconductor layer may be in contact with the first semiconductor pattern and the substrate 100. The second lower semiconductor layer may be conformally formed, so it need not completely fill the lower channel holes 120. The second lower semiconductor layer may be a semiconductor material layer (e.g., a polycrystalline silicon layer, a single-crystalline silicon layer, or an amorphous silicon layer) that is formed using one of an ALD technique or a CVD technique. A first insulating layer may be formed on the second lower semiconductor layer to fill the lower channel holes 120. The first insulating layer and the second lower semiconductor layer may be planarized until the lower thin-layer structure TS1 is exposed, thereby forming a second lower semiconductor pattern and a lower filling insulation layer 150 in each of the lower channel holes 120. The first and second lower semiconductor patterns may include the first vertical semiconductor pattern 135. The first vertical semiconductor pattern 135 disposed in the lower channel hole 120 may have a cup shape of which a top end is open.

The lower filling insulation layer 150 may fully fill each of the lower channel holes 120. The lower filling insulation layer 150 may include one of insulating materials or silicon oxide, which may be formed using a spin-on-glass (SOG) technique.

First connecting semiconductor patterns 130 may be connected to the first vertical semiconductor patterns 135, respectively. Upper portions of the first vertical semiconductor patterns 135 and upper portions of the lower filling insulation layers 150 may be recessed to form recessed regions. Thus, top surfaces of the first vertical semiconductor patterns 135 and top surfaces of the lower filling insulation layers 150 may be lower than top surfaces of the lower vertical insulators 140. The recessed regions may be filled with a semiconductor material, and the semiconductor material may be planarized to form the first connecting semiconductor patterns 130. Top surfaces of the first connecting semiconductor patterns 130 may be coplanar with the top surface of the lower thin-layer structure TS1, which may be planarized. The first connecting semiconductor patterns 130 may be doped with N-type dopants. A concentration of the N-type dopant of the first connecting semiconductor pattern 130 may be in a range of from about $10^{-19}/cm^3$ to about $10^{-17}/cm^3$.

The first vertical semiconductor pattern 135 and the first connecting semiconductor pattern 130 which may be disposed in each of the lower channel holes 120 may constitute a lower channel structure CS1.

Figure 3D:
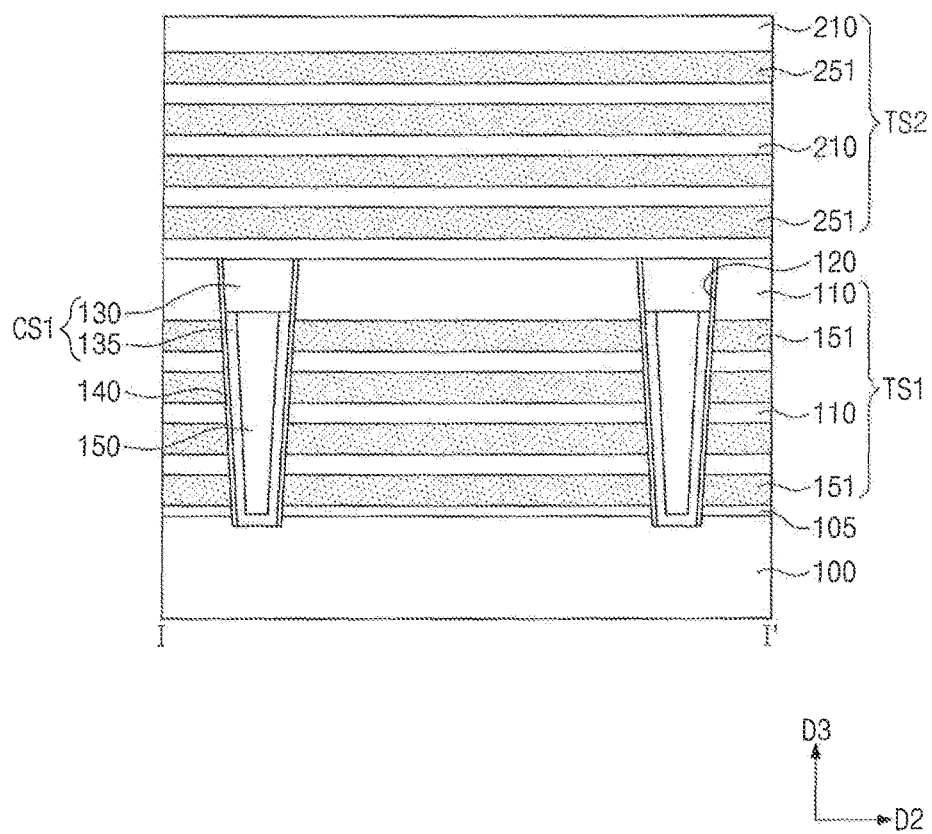

Referring to FIGS. 2A and 3D, upper sacrificial layers 251 and upper insulating layers 210 may be alternately and repeatedly stacked on the lower thin-layer structure TS1 to form an upper thin-layer structure TS2. A formation method of the upper sacrificial layers 251 and the upper insulating layers 210 may be substantially the same as that of the lower sacrificial layers 151 and the lower insulating layers 110 described with reference to FIG. 3A.

Figure 3E:
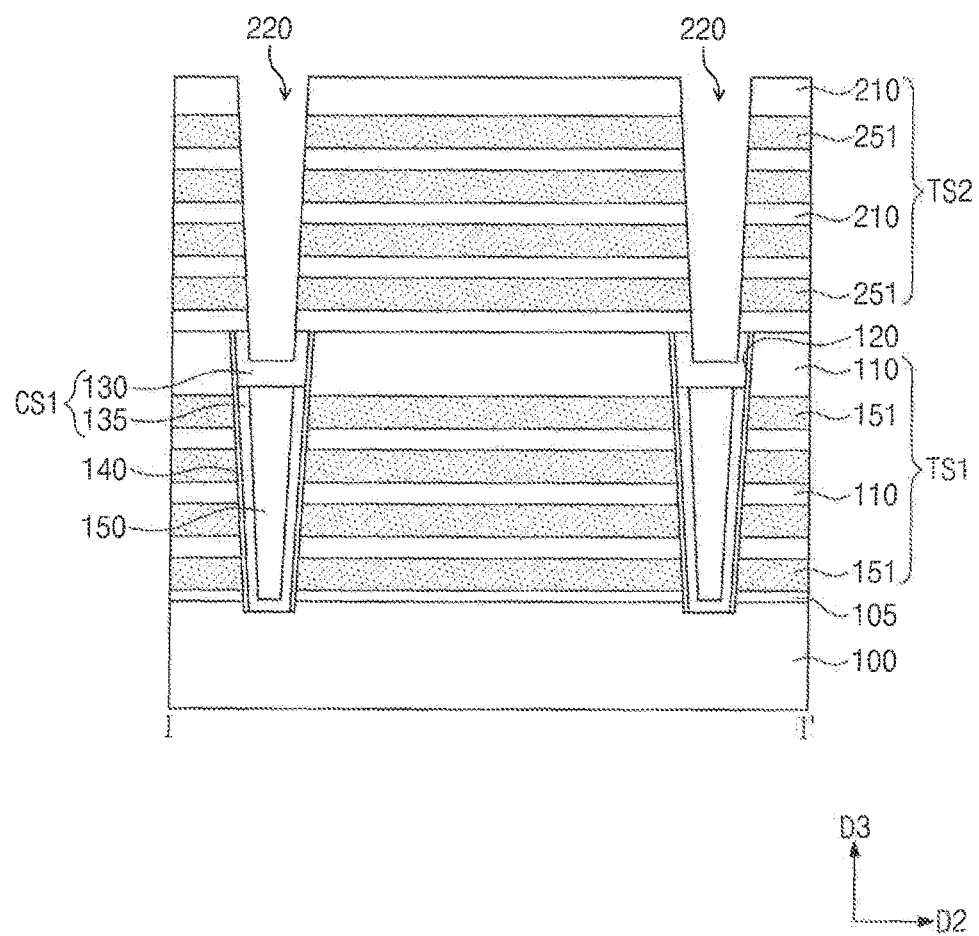

Referring to FIGS. 2A and 3E, upper channel holes 220 may be formed to penetrate the upper thin-layer structure TS2 and an upper portion of the lower thin-layer structure TS1. The upper channel holes 220 may expose the first connecting semiconductor patterns 130. The first connecting semiconductor patterns 130 may be recessed by over-etching during an etching process for the formation of the upper channel holes 220. Thus, the upper channel holes 220 may expose inner sidewalls of the recessed regions of the first connecting semiconductor patterns 130. The formation method of the upper channel holes 220 may be substantially the same as that of the lower channel holes 120 described with reference to FIG. 3B.

Figure 3F:
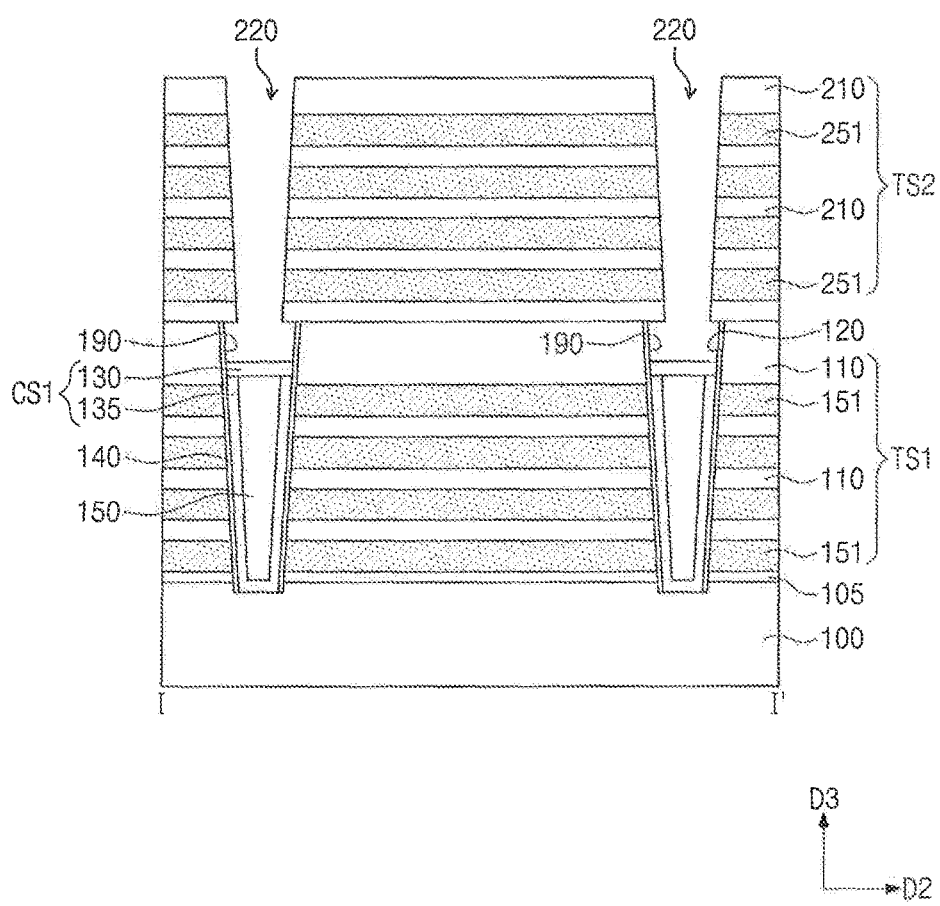

Referring to FIGS. 2A and 3F, the exposed inner sidewalls of the first connecting semiconductor patterns 130 may be etched to form recessed holes 190. The recessed holes 190 may be formed by wet-etching the first connecting semiconductor patterns 130. Each of the recessed holes 190 may include a region between the first connecting semiconductor pattern 130 and the upper thin-layer structure TS2. Each of the recessed holes 190 may include a region that is surrounded by a bottom surface of a lowermost upper insulating layer 210, an inner sidewall of an upper portion of the lower vertical insulator 140, and the top surface of the first connecting semiconductor pattern 130. The first connecting semiconductor patterns 130 may be etched to have substantially flat top surfaces.

Figure 3G:
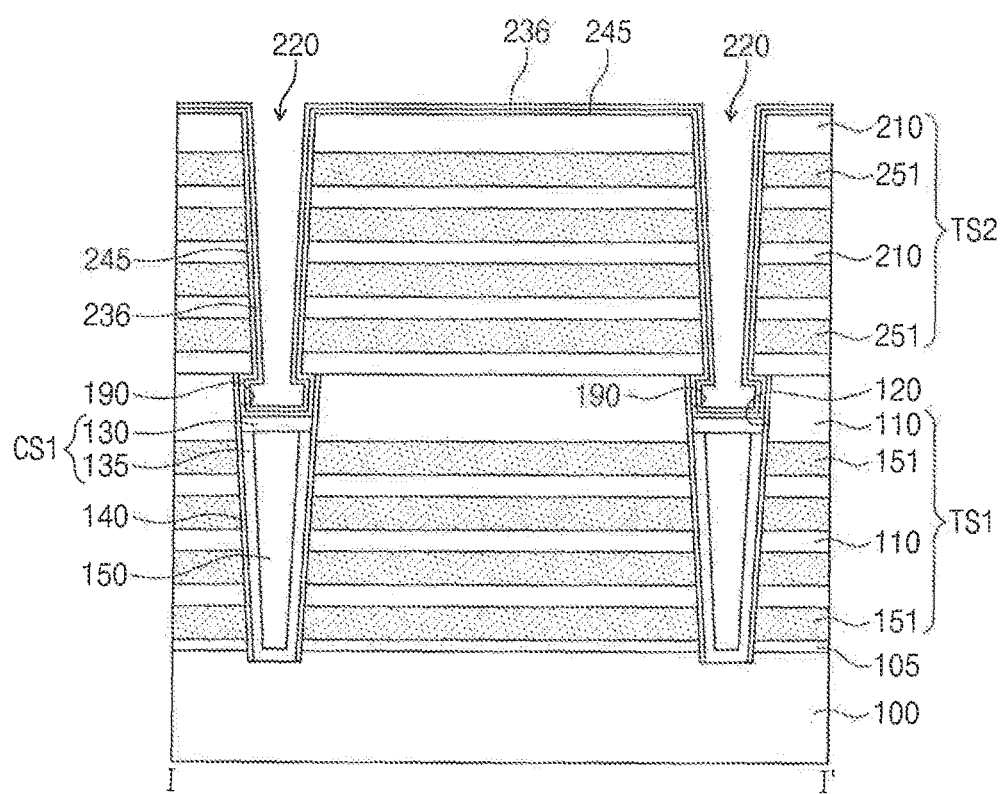
Figure 3G:
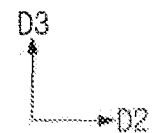

Referring to FIGS. 2A and 3G, an upper vertical insulating layer 245 and a first upper semiconductor layer 236 may be sequentially formed to cover inner surfaces of the upper channel holes 220 and inner surfaces of the recessed holes 190. The upper vertical insulating layer 245 and the first upper semiconductor layer 236 may partially fill the upper channel holes 220 and the recessed holes 190. The upper channel holes 220 and the recessed holes 190 need not be completely filled with the upper vertical insulating layer 245 and the first upper semiconductor layer 236. The upper vertical insulating layer 245 may cover the top surfaces of the first connecting semiconductor patterns 130 which may be exposed by the recessed holes 190. The first upper semiconductor layer 236 may be disposed on the upper vertical insulating layer 245. Other processes of the method of forming the upper vertical insulating layer 245 and the first upper semiconductor layer 236 may be substantially the same as corresponding processes of the method of forming the lower vertical insulating layer and the first lower semiconductor layer described with reference to FIG. 3C.

Figure 3H:
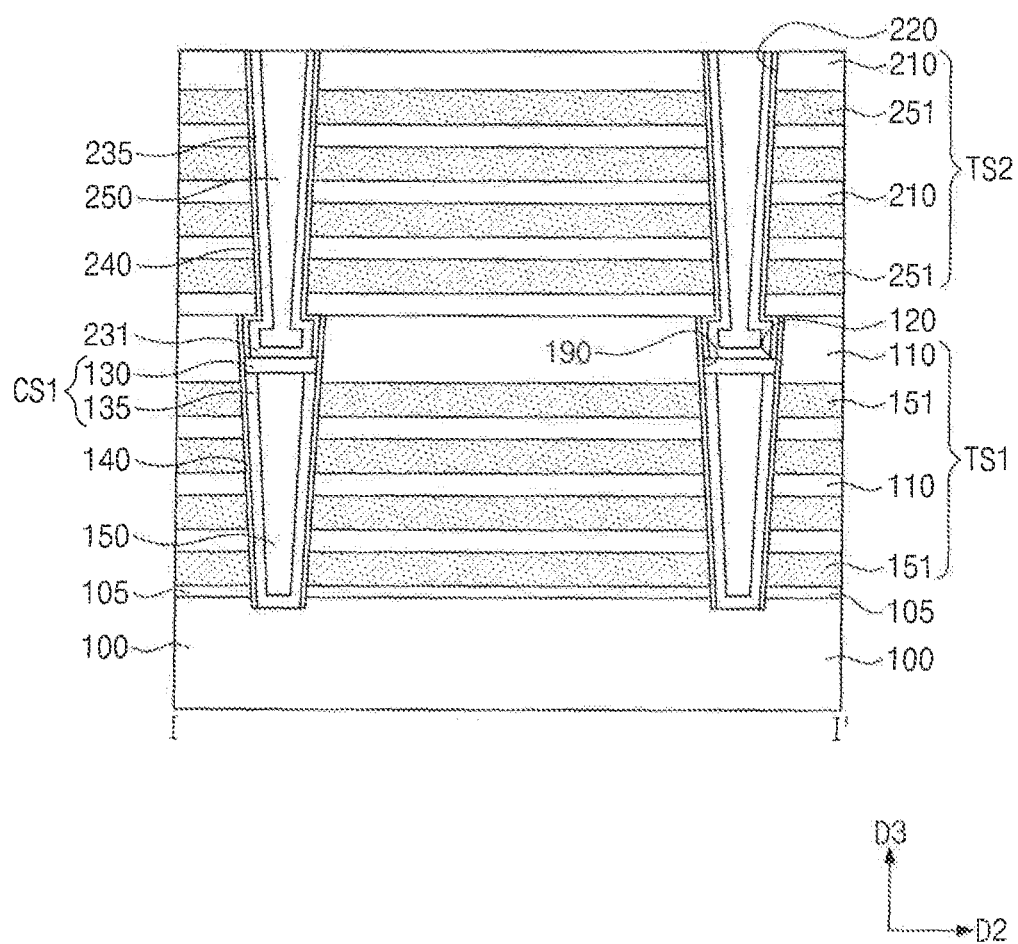

Referring to FIGS. 2A and 3H, the upper vertical insulator 240 and the second vertical semiconductor pattern 235 may be formed in each of the upper channel holes 220. The upper vertical insulator 240 and the second vertical semiconductor pattern 235 may cover the inner sidewall of each of the upper channel holes 220 and may expose the top surface of the first connecting semiconductor pattern 130 disposed under each of the upper channel holes 220. The first upper semiconductor layer 236 and the upper vertical insulating layer 245 may be anisotropically etched to expose the top surfaces of the first connecting semiconductor patterns 130. Thus, the upper vertical insulator 240 and the second vertical semiconductor pattern 235 may be formed on the inner sidewall of the upper channel hole 220 and the inner sidewall of the recessed hole 190. Each of the upper vertical insulator 240 and the first upper semiconductor pattern may have a hollow cylindrical shape having both ends open. An outer sidewall of the upper vertical insulator 240 may have a stepped profile at a contact portion of the lower and upper thin-layer structures TS1 and TS2.

A second upper semiconductor layer may be deposited on the substrate 100 having the upper vertical insulator 240 and the second vertical semiconductor pattern 235. The second upper semiconductor layer may be conformally formed to not completely fill the upper channel hole 220 and the recessed hole 190. A second insulating layer may be formed on the second upper semiconductor layer to fill the upper channel hole 220 and the recessed hole 190. The second insulating layer and the second upper semiconductor layer may be planarized down to a top surface of the upper thin-layer structure TS2, thereby forming a second upper semiconductor pattern and the upper filling insulating layer 250 in the upper channel hole 220 and the recessed hole 190. The second upper semiconductor pattern may be in contact with the first upper semiconductor pattern and the first connecting semiconductor pattern 130. The first and second upper semiconductor patterns may include the second vertical semiconductor pattern 235. The second vertical semiconductor pattern 235 may be formed to have a cup shape of which a top end is open. An outer sidewall of the second vertical semiconductor pattern 235 may have a stepped profile at the contact portion of the lower and upper thin-layer structures TS1 and TS2. Since the second vertical semiconductor pattern 235 is formed to cover the exposed top surface of the first connecting semiconductor pattern 130, the second vertical pattern 235 may be in direct contact with the first connecting semiconductor pattern 130. Thus, the second vertical semiconductor pattern 235 may be electrically connected to the first vertical semiconductor pattern 135 with the first connecting semiconductor pattern 130 disposed therebetween.

The upper filling insulation layer 250 may be formed to completely fill an inner region of the upper channel hole 220. Other processes of the method of forming the upper vertical insulator 240, the second vertical semiconductor pattern 235, and the upper filling insulating layer 250 may be substantially the same as described with reference to FIG. 3C.

Figure 3I:
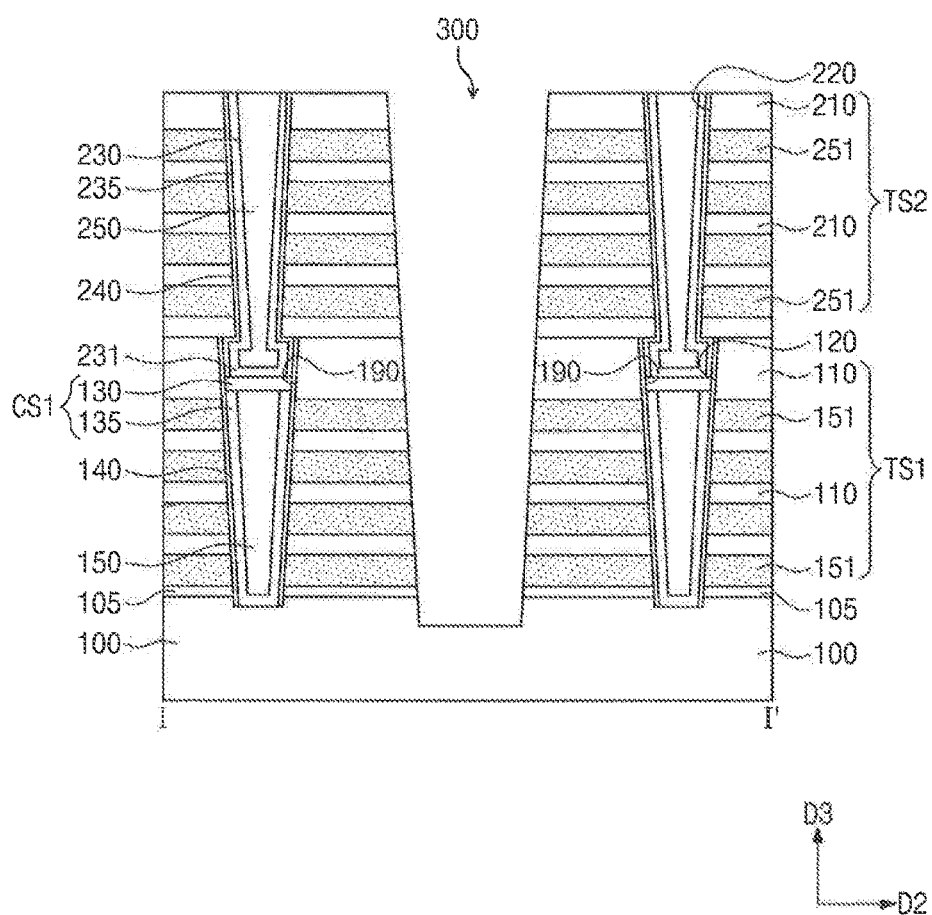

Referring to FIGS. 2A and 3I, the upper thin-layer structure TS1 and the lower thin-layer structure TS2 may be patterned to form trenches 300 exposing the substrate 100. Each of the trenches 300 may be disposed at each side of a column including the lower and upper channel holes 120 and 220 disposed along the first direction D1. When the lower and upper channel holes 120 and 220 includes a plurality of columns, the trenches 300 and the columns may be alternately disposed along the second direction D2.

Forming the trenches 300 may include forming second mask patterns (not shown) defining the trenches 300 and etching the upper and lower thin-layer structures TS2 and TS1 using the second mask patterns as an etch mask. The trenches 300 may expose sidewalls of the lower and upper sacrificial layers 151 and 251 and sidewalls of the lower and upper insulating layers 110 and 210. When viewed from a plan view, each of the trenches 300 may have a line shape extending in the first direction D1. The trenches 300 may expose the top surface of the substrate 100. Due to an anisotropic etching process for the formation of the trenches 300, the trenches 300 may have a varied width depending on a distance from the substrate 100.

Figure 3J:
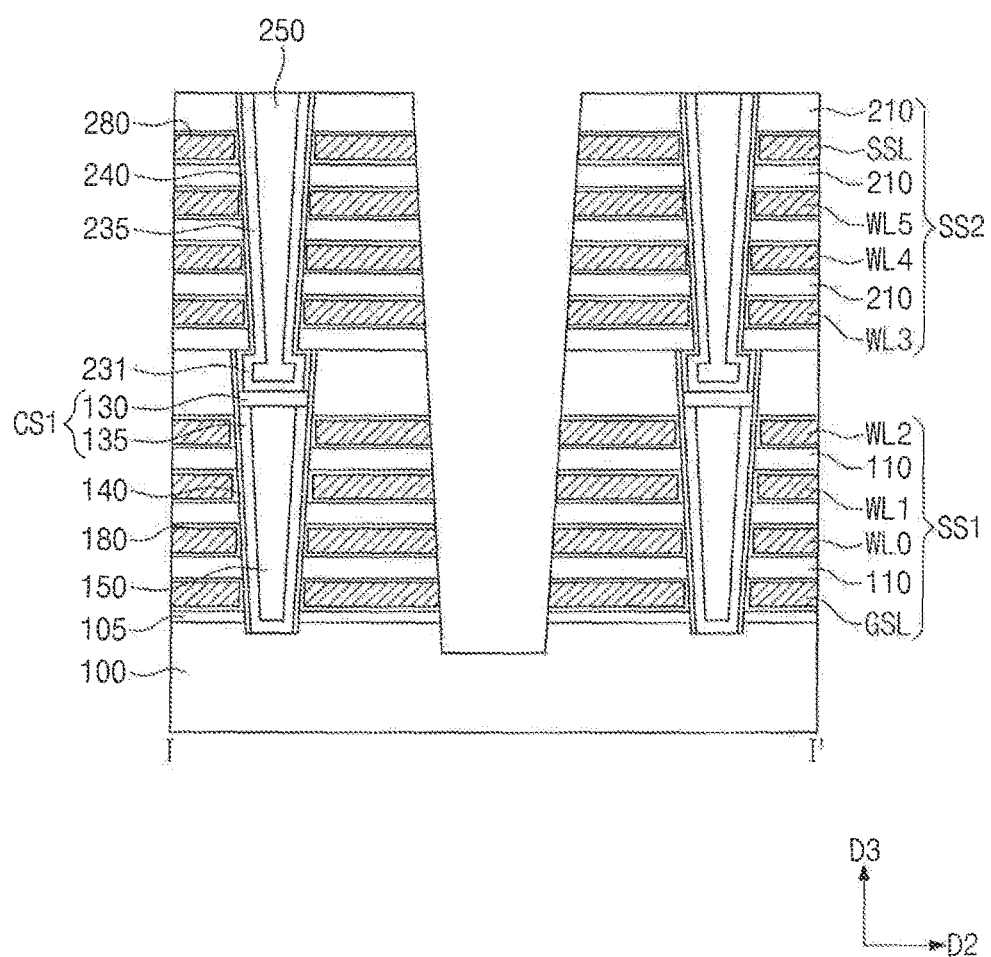

Referring to FIGS. 2A and 3J, the lower and upper sacrificial layers 151 and 251 exposed by the trenches 300 may be selectively removed to form recess regions. The recess regions may be gap regions that horizontally extend from the trenches 300. The recess regions may expose sidewalls of the lower and upper vertical insulators 140 and 240.

Lower horizontal insulators 180 and upper horizontal insulators 280 may be formed to partially fill the recess regions. The lower horizontal insulators 180 and upper horizontal insulators 280 may be formed to cover inner surfaces of the recess regions. Lower gate electrodes GSL and WL0 to WL2 and upper gate electrodes WL3 to WL5 and SSL may be formed to fill the rest of the recess regions. Forming the lower and upper horizontal insulators 180 and 280 and the lower and upper gate electrodes GSL, WL0 to WL5, and SSL may include forming a horizontal layer covering the inner surfaces of the recess regions, forming a gate layer (e.g., a metal layer) filling the recess regions on the horizontal layer, and removing the horizontal layer and the gate layer that are disposed outside the recess regions. In some exemplary embodiments of the present inventive concept, each of the lower and upper horizontal insulators 180 and 280 may include at least a portion of a data storage layer. Each of the lower and upper horizontal insulators 180 and 280 may include a single layer or a plurality of thin layers, similarly to the vertical insulators 140 and 240. In some exemplary embodiments of the present inventive concept, each of the lower and upper horizontal insulators 180 and 280 may include at least a portion of a blocking dielectric layer of a charge trap-type non-volatile memory transistor.

The lower gate electrodes GSL and WL0 to WL2 and the lower insulating layers 110 which may be alternately stacked may be included in the lower stack structure SS1. The upper gate electrodes WL3 to WL5 and SSL and the upper insulating layers 210 which may be alternately stacked may be included in the upper stack structure SS2.

Referring again to FIGS. 2A and 2B, common source lines CSL may be formed in the substrate 100 after the formation of the lower and upper gate electrodes GSL, WL0 to WL5, and SSL. The common source lines CSL may be formed by an ion implantation process. The common source lines CSL may be formed in the substrate 100 exposed by the trenches 300. The common source lines CSL and the substrate 100 may form PN junctions. In some exemplary embodiments of the present inventive concept, the common source lines CSL may be connected to each other so as to be in an equipotential state. In some exemplary embodiments of the present inventive concept, the common source lines CSL may be electrically isolated from each other so as to have different potentials. In some exemplary embodiments of the present inventive concept, the common source lines CSL may be classified into a plurality of source groups of which each includes a plurality of the common source lines CSL, and the source groups may be electrically isolated from each other so as to have different potentials.

The electrode isolation pattern 170 may be formed to fill each of the trenches 300. The electrode isolation pattern 170 may include at least one of a silicon oxide layer, a silicon nitride layer, or a silicon oxynitride layer.

Second connecting semiconductor patterns 230 may be formed to be connected to the second vertical semiconductor patterns 235, respectively. Upper portions of the second vertical semiconductor patterns 235 and upper portions of the upper filling insulation layers 250 may be recessed to form recessed regions. Thus, top surfaces of the second vertical semiconductor patterns 235 and top surfaces of the upper filling insulation layers 250 may be lower than top surfaces of the upper vertical insulators 240. The recessed regions may be filled with a semiconductor material, and the semiconductor material may be planarized to form the second connecting semiconductor patterns 230. Top surfaces of the second connecting semiconductor patterns 230 may be coplanar with the top surface of the upper stack structure SS2.

The second vertical semiconductor pattern 235 and the second connecting semiconductor pattern 230 which may be sequentially stacked may include the upper channel structure CS2. A plurality of the upper channel structures CS2 may be provided to penetrate the upper stack structure SS2.

Bit lines BL may be formed to be connected to the second connecting semiconductor patterns 230. The bit lines BL may be electrically connected to the upper channel structures CS2 and the lower channel structures CS1 through the second connecting semiconductor patterns 230.

Figure 4A:
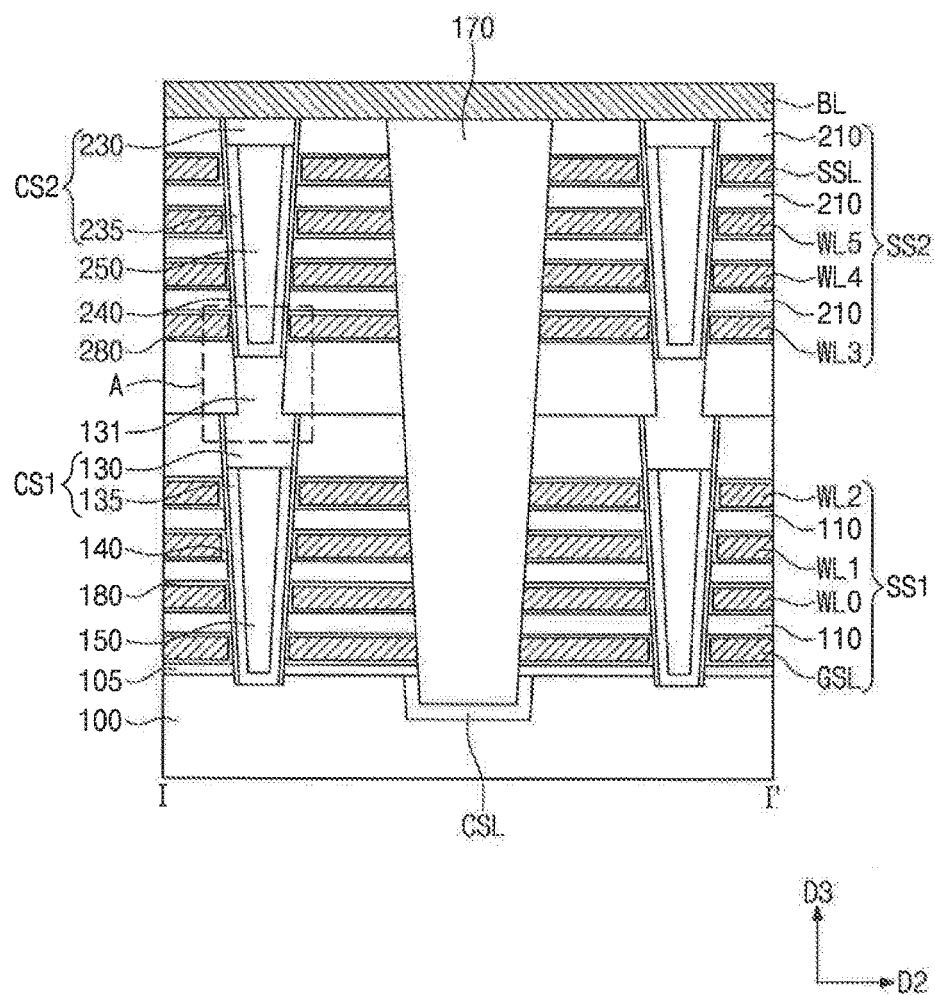
FIG. 4A is a cross-sectional view corresponding to line I-I' of FIG. 2A illustrating a modified embodiment of a 3D semiconductor memory device according to some exemplary embodiments of the present inventive concept.

FIG. 4A is a cross-sectional view corresponding to line I-I' of FIG. 2A illustrating a modified embodiment of a 3D semiconductor memory device according to some exemplary embodiments of the present inventive concept. In the present exemplary embodiment of the present inventive concept, the same elements as described in the embodiment of FIGS. 2A and 2B may be indicated by the same reference numerals or the same reference designators, and the descriptions thereto may be omitted or mentioned briefly. A circuit diagram of a 3D semiconductor memory device according to the present exemplary embodiment of the present inventive concept may be substantially the same as described with reference to FIG. 1.

Referring to FIG. 4A, the plurality of lower channel structures CS1 may penetrate the lower stack structure SS1 and may be electrically connected to the substrate 100. The plurality of upper channel structures CS2 may penetrate the upper stack structure SS2 and may be electrically connected to the lower channel structures CS1, respectively. The connections between the lower and upper channel structures CS1 and CS2 will be described in more detail below.

Each of the lower channel structures CS1 may sequentially penetrate a lower portion of the upper stack structure SS2 and the lower stack structure SS1 and may be electrically connected to the substrate 100. Each of the lower channel structures CS1 may include the first vertical semiconductor pattern 135 connected to the substrate 100 and the first connecting semiconductor pattern 130 disposed on the first vertical semiconductor pattern 135. The first connecting semiconductor pattern 130 may extend from the top surface of the first vertical semiconductor pattern 135 in the third direction D3. The first connecting semiconductor pattern 130 may include a protrusion 131 that may extend in the third direction D3 to penetrate the lower portion of the upper stack structure SS2.

The outer sidewall of the first connecting semiconductor pattern 130 may have a stepped profile at the contact portion of the lower and upper stack structures SS1 and SS2. The outer diameter of the first connecting semiconductor pattern 130 may increase along the third direction D3 and may be discontinuously reduced at the contact portion of the uppermost lower insulating layer 110 and the lowermost upper insulating layer 210.

The upper channel structures CS2 may penetrate the upper stack structure SS2. Each of the upper channel structures CS2 may include the second vertical semiconductor pattern 235 connected to the first connecting semiconductor pattern 130 and the second connecting semiconductor pattern 230 disposed on the second vertical semiconductor pattern 235. The second connecting semiconductor pattern 230 may extend from the top surface of the second vertical semiconductor pattern 235 in the third direction D3.

The lower vertical insulator 140 may be disposed between the lower stack structure SS1 and each of the lower channel structures CS1. The lower vertical insulator 140 may have a pipe or a cylindrical shape. A top end and a bottom end of the lower vertical insulator 140 may be open. The lower vertical insulator 140 may cover the inner sidewall of the lower stack structure SS1.

The upper vertical insulator 240 may be disposed between the upper stack structure SS2 and each of the upper channel structures CS2. The upper vertical insulator 240 may have a pipe or a cylindrical shape. A top end and a bottom end of the lower vertical insulator 240 may be open. The upper vertical insulator 240 may cover the inner sidewall of the upper stack structure SS2. However, the upper vertical insulator 240 need not completely cover the inner sidewall of the upper stack structure SS2 and may be in contact with the top surface of the protrusion 131 of the first connecting semiconductor pattern 130.

Figure 4B:
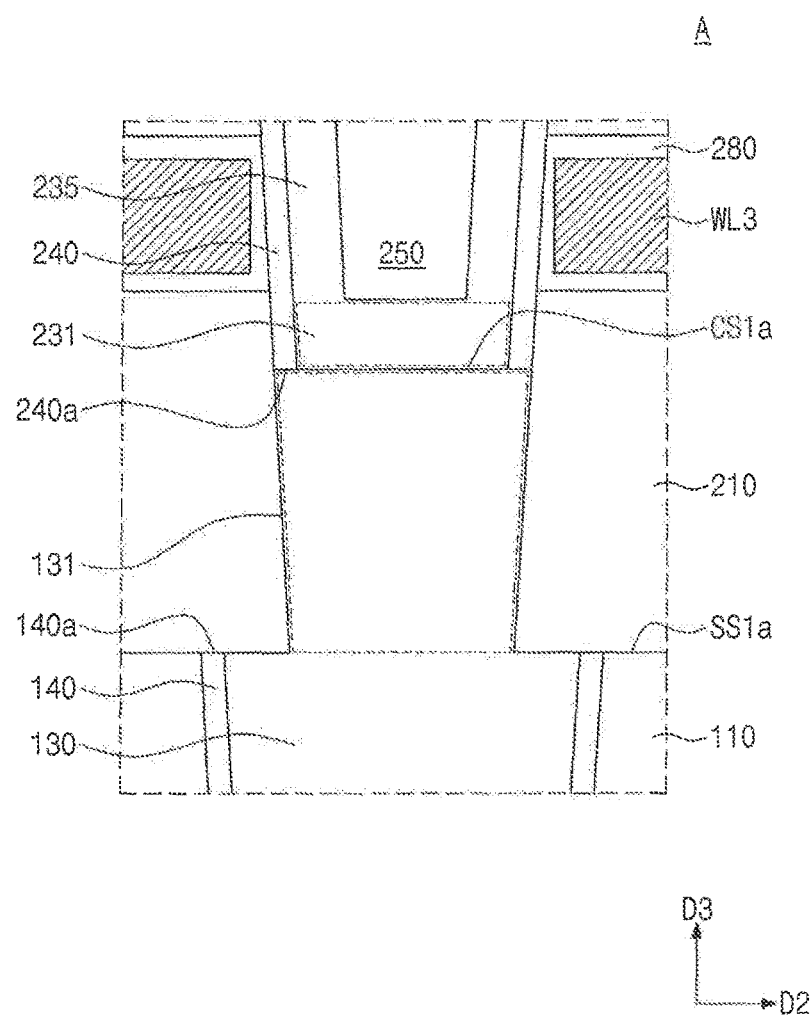
FIG. 4B is an enlarged view of a portion 'A' of FIG. 4A.

FIG. 4B is an enlarged view of a portion 'A' of FIG. 4A.

Referring to FIGS. 4A and 4B, the lower and upper channel structures CS1 and CS2 and the lower and upper vertical insulators 140 and 240 will be described in more detail below. Hereinafter, the descriptions of the same technical features as described with reference to FIGS. 2A and 2B may be omitted or mentioned briefly.

The top surface 140a of the lower vertical insulator 140 may be coplanar with the top surface SS1a of the lower stack structure SS1. The bottom surface 240a of the upper vertical insulator 240 may be coplanar with the top surface of the protrusion 131 of the first connecting semiconductor pattern 130. The bottom surface 240a of the upper vertical insulator 240 may be in contact with the top surface of the protrusion 131 of the first connecting semiconductor pattern 130. The sidewall of the upper vertical insulator 240 need not overlap with the sidewall of the lower vertical insulator 140.

The topmost surface CS a of the lower channel structure CS1 may be disposed at a different level from the top surface 140a of the lower vertical insulator 140. In the present exemplary embodiment of the present inventive concept, the topmost surface CS1a of the lower channel structure CS1 may be the top surface of the protrusion 131 of the first connecting semiconductor pattern 130, and the top surface of the protrusion 131 may be higher than the top surface 140a of the lower vertical insulator 140.

The protrusion 131 may be disposed between the lower vertical insulator 140 and the upper vertical insulator 240 in a cross-sectional view. The bottom surface of the protrusion 131 may be coplanar with the top surface SS1a of the lower stack structure SS1. The top surface of the protrusion 131 may be a flat surface and may be in direct contact with the bottom portion 231 of the second vertical semiconductor pattern 235. The top surface of the protrusion 131 may be lower than the bottom surface of the lowermost upper gate electrode WL3. The sidewall of the protrusion 131 may be in direct contact with the inner sidewall of the upper stack structure SS2.

The protrusion 131 of the first connecting semiconductor pattern 130 need not laterally overlap with the upper channel structure CS2. The second vertical semiconductor pattern 235 may be vertically stacked on the first connecting semiconductor pattern 130 and need not be disposed at a side of the first connecting semiconductor pattern 130.

In the 3D semiconductor memory device according to the present exemplary embodiment of the present inventive concept, the upper channel structure CS2 is vertically stacked on the lower channel structure CS1 and does not laterally overlap the lower channel structure CS1. Thus, the upper channel structure CS2 need not be screened by the lower channel structure CS1 to prevent or reduce the problem caused by the screen effect.

Figure 5A:
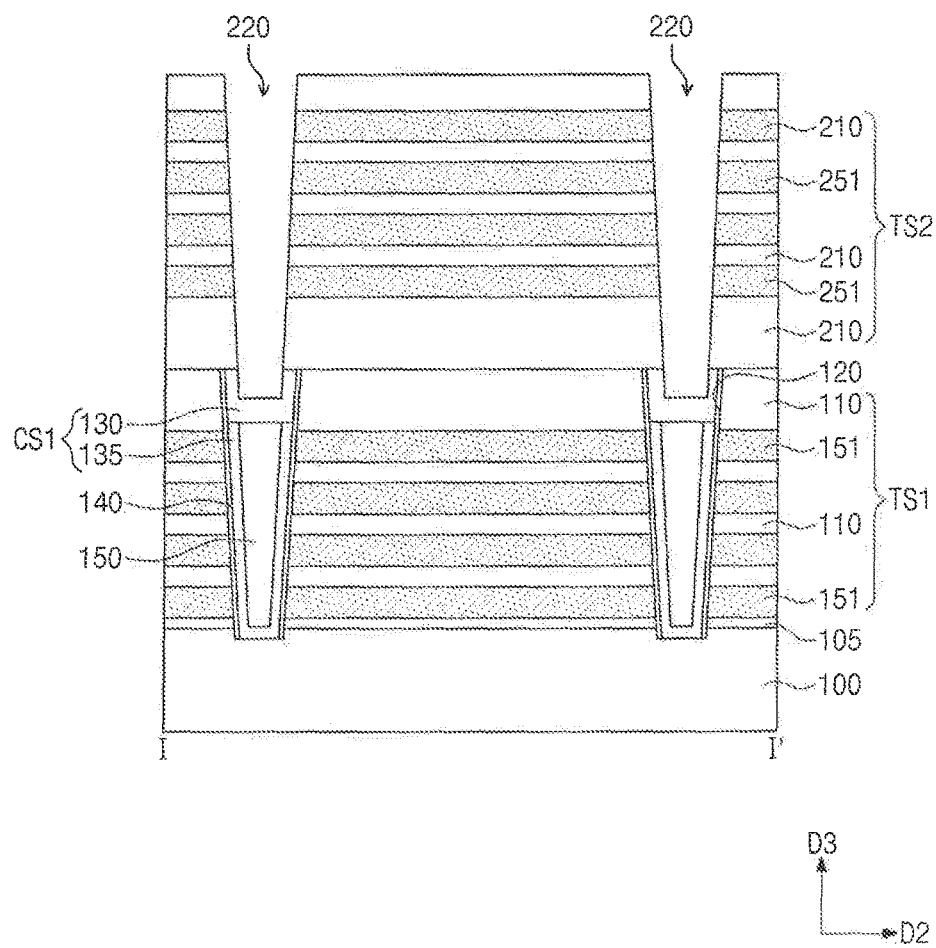
FIGS. 5A, 5B and 5C are cross-sectional views illustrating a modified embodiment of a method of manufacturing a 3D semiconductor memory device according to some exemplary embodiments of the present inventive concept.
Figure 5B:
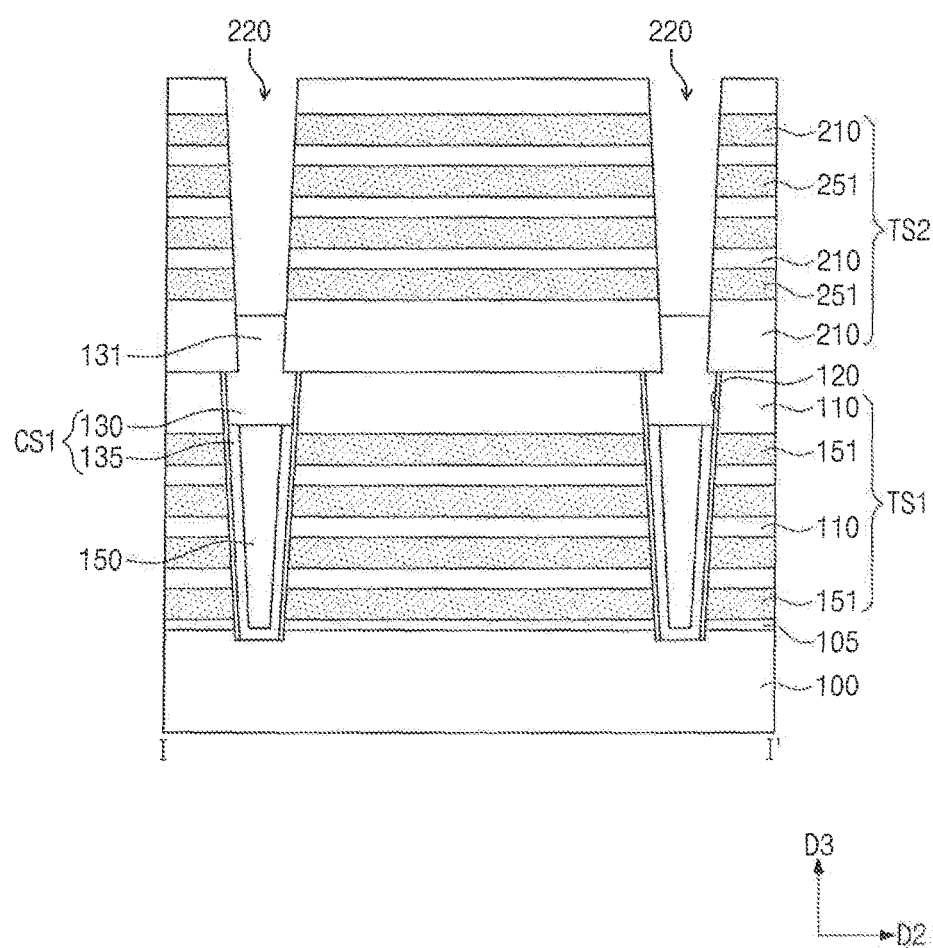
Figure 5C:
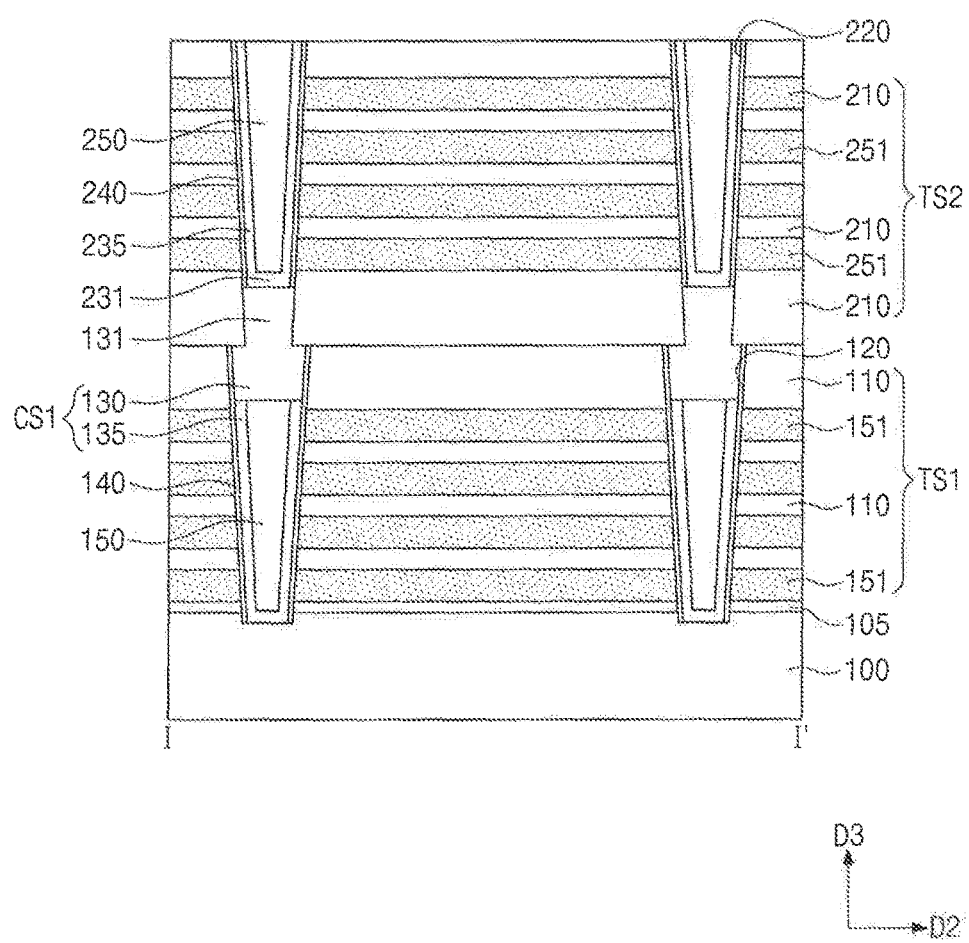

FIGS. 5A, 5B and 5C are cross-sectional views illustrating a modified embodiment of a method of manufacturing a 3D semiconductor memory device according to some exemplary embodiments of the present inventive concept. In the present exemplary embodiment of the present inventive concept, the descriptions of the same technical features as described with reference to FIGS. 3A to 3J may be omitted or described briefly.

Referring to FIG. 5A, upper channel holes 220 exposing inner surfaces of first connecting semiconductor patterns 130 may be formed to penetrate the upper thin-layer structure TS2 and the upper portion of the lower thin-layer structure TS1, as described with reference to FIGS. 3A to 3E. In the present exemplary embodiment of the present inventive concept, the lowermost upper insulating layer 210 may be thicker than the lowermost upper insulating layer 210 of the exemplary embodiments of the present inventive concept described above.

Referring to FIG. 5B, a selective epitaxial growth (SEG) process may be performed on the exposed inner surfaces of the first connecting semiconductor patterns 130 to form protrusions 131. The first connecting semiconductor patterns 130 may extend along the upper channel holes 220 in the third direction D3 by the SEG process. Portions of the first connecting semiconductor patterns 130, which may be higher than the top surface of the lower thin-layer structure TS1, may be defined as the protrusions 131. Top surfaces of the protrusions 131 may be higher than the bottom surface of a lowermost upper sacrificial layer 251. The top surfaces of the protrusions 131 may be disposed at a level between top and bottom surfaces of the lowermost upper insulating layer 210 by the SEG process. Outer sidewalls of the protrusions 131 may be in direct contact with inner sidewalls of lower portions of the upper channel holes 220.

Referring to FIG. 5C, second vertical semiconductor patterns 235 may be formed in the upper channel holes 220, respectively. The second vertical semiconductor patterns 235 may be in direct contact with the protrusions 131, respectively.

The upper vertical insulator 240 and the second vertical semiconductor pattern 235 may be formed to cover the inner sidewall of each of the upper channel holes 220 and to expose the protrusion 131 under each of the upper channel holes 220. An upper vertical insulating layer and a first upper semiconductor layer may be sequentially formed on the substrate 100 having the upper channel holes 220 and the protrusions 131. The upper vertical insulating layer and the first upper semiconductor layer may partially fill the upper channel holes 220. The upper channel holes 220 need not be completely filled with the upper vertical insulating layer and the first upper semiconductor layer. The upper vertical insulating layer may cover the top surfaces of the protrusions 131 exposed by the upper channel holes 220. The first upper semiconductor layer may be formed on the upper vertical insulating layer.

The first upper semiconductor layer and the upper vertical insulating layer may be anisotropically etched to expose the top surfaces of the protrusions 131. Thus, the upper vertical insulator 240 and a first upper semiconductor pattern may be sequentially formed on the inner sidewall of each of the upper channel holes 220. Each of the upper vertical insulator 240 and the first upper semiconductor pattern may have a hollow cylindrical shape of which top and bottom ends are open.

The second upper semiconductor layer may be deposited on the substrate 100 having the first upper semiconductor pattern and the upper vertical insulator 240. The second upper semiconductor layer may be conformally formed not to completely fill the upper channel hole 220. An insulating layer may be formed on the second upper semiconductor layer to fill the upper channel holes 220. The insulating layer and the second upper semiconductor layer may be planarized to form the second vertical semiconductor pattern 235 and the upper filling insulation layer 250 in each of the upper channel holes 220. The second vertical semiconductor pattern 235 may have a cup shape of which a top end is open.

The upper filling insulation layer 250 may be formed to completely fill the upper channel hole 220.

Referring again to FIGS. 3I and 4A, the upper thin-layer structure TS2 and the lower thin-layer structure TS1 may be patterned to form trenches 300 exposing the substrate 100. The lower and upper sacrificial layers 151 and 251 exposed by the trenches 300 may be selectively removed to form recess regions. Lower and upper horizontal insulators 180 and 280 and lower and upper gate electrodes GSL, WL0 to WL5, and SSL may be formed in the recess regions. Common source lines CSL, electrode isolation patterns 170, second connecting semiconductor patterns 230, and bit lines BL may be formed as described with reference to FIGS. 3I, 3J, and 2B.

Figure 6:
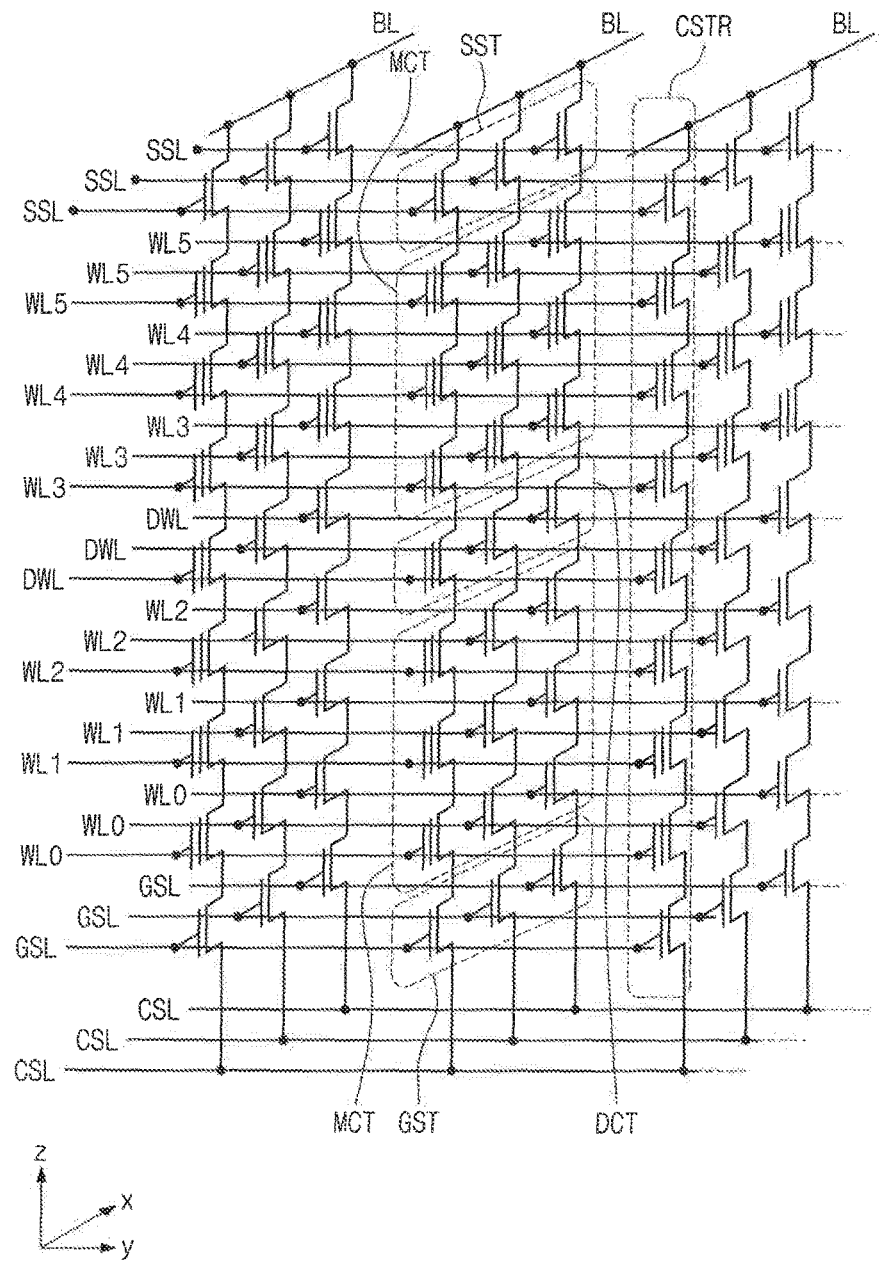
FIG. 6 is a schematic circuit diagram illustrating a cell array of a 3D semiconductor memory device according to some exemplary embodiments of the present inventive concept.

FIG. 6 is a schematic circuit diagram illustrating a cell array of a 3D semiconductor memory device according to some exemplary embodiments of the present inventive concept. In the present exemplary embodiment of the present inventive concept, the descriptions to the same technical features as described in the embodiment of FIG. 1 may be omitted or mentioned briefly.

Each of cell strings CSTR may include the ground selection transistor GST connected to the common source line CSL, the string selection transistor SST, connected to the bit line BL, and a plurality of memory cell transistors MCT disposed between the ground selection transistor GST and the string selection transistor SST. Each of the cell strings CSTR may include at least one dummy cell transistor DCT disposed between the memory cell transistors MCT. The dummy cell transistor DCT may be connected to a dummy gate electrode DWL. The plurality of memory cell transistors MCT may include lower memory cell transistors disposed under the dummy cell transistor DCT and upper memory cell transistors disposed on the dummy cell transistor DCT. The ground selection transistor GST, the memory cell transistors MCT, the dummy cell transistor DCT, and the string selection transistor SST may be connected in series to each other.

Figure 7:
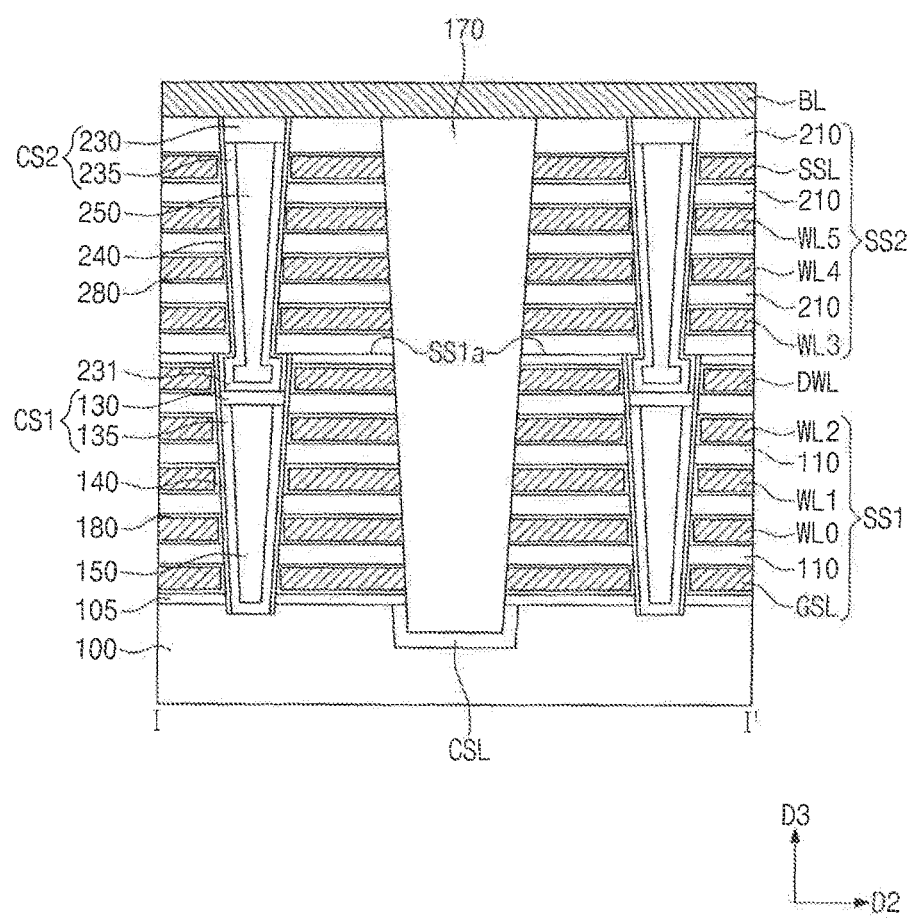
FIG. 7 is a cross-sectional view corresponding to line I-I' of FIG. 2A illustrating a 3D semiconductor memory device according to some exemplary embodiments of the present inventive concept.

FIG. 7 is a cross-sectional view corresponding to the line I-I' of FIG. 2A illustrating a 3D semiconductor memory device according to some exemplary embodiments of the present inventive concept. In the present exemplary embodiment of the present inventive concept, the descriptions to the same technical features as described in the exemplary embodiment of FIGS. 2A and 2B may be omitted or mentioned briefly.

Referring to FIG. 7, the outer sidewall of the second vertical semiconductor pattern 235 may have a stepped profile in a contact portion of lower and upper channel structures CS1 and CS2, as described with reference to FIGS. 2A and 2B. Thus, a channel characteristic of the lower portion of the upper channel structure CS2 may be different from that of the lower channel structure CS1. To make uniform and stabilize program, read, and erase characteristics of the 3D semiconductor memory device, the dummy gate electrode DWL may be disposed adjacent to the contact portion of the lower and upper channel structures CS1 and CS2. The lower horizontal insulator 180 covering top and bottom surfaces of the dummy gate electrode DWL may be disposed between the dummy gate electrode DWL and the lower insulating layers 110. The lower horizontal insulator 180 adjacent to the dummy gate electrode DWL may extend to be disposed between the dummy gate electrode DWL and the lower channel structure CS1.

A bottom surface of the second vertical semiconductor pattern 235 may be disposed at the same level as or a higher level than the bottom surface of the dummy gate electrode DWL. The top surface of the first vertical semiconductor pattern 135 may be disposed at the same level as or a lower level than the bottom surface of the dummy gate electrode DWL.

Since the dummy gate electrode DWL may be adjacent to the contact portion of the lower and upper channel structures CS1 and CS2, the occurrence of a non-uniform channel characteristic of the 3D semiconductor memory device may be reduced or prevented.

Figure 8:
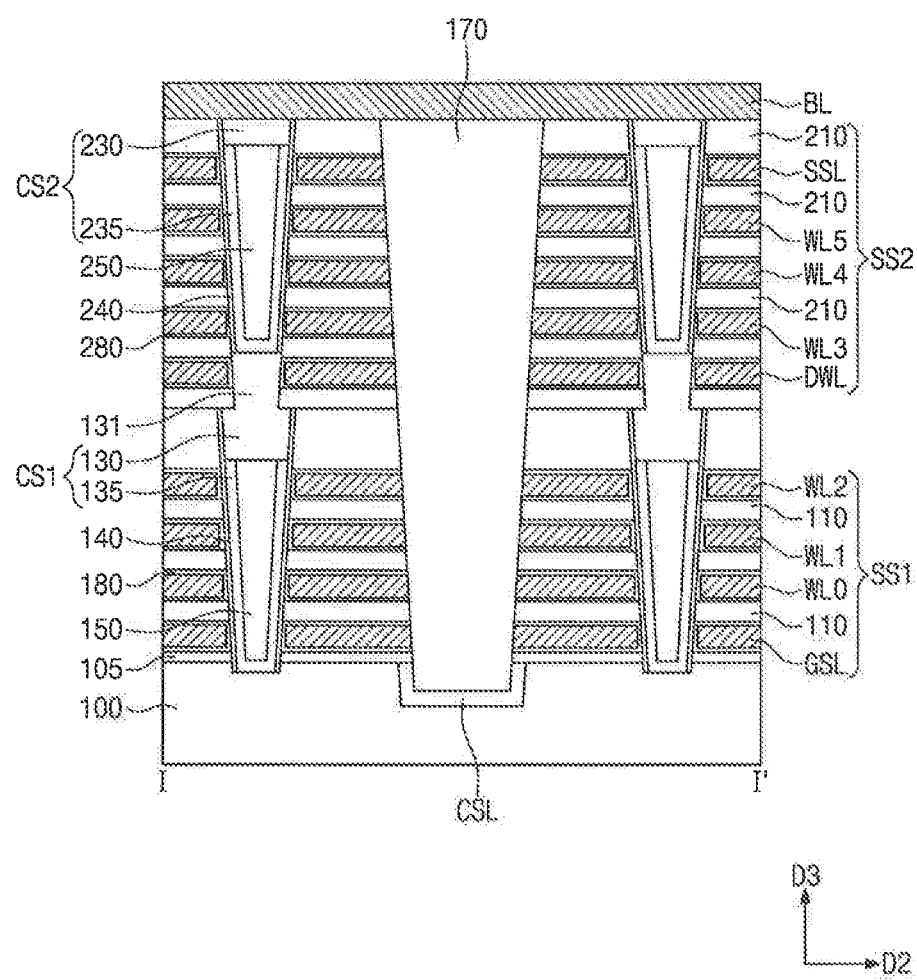
FIG. 8 is a cross-sectional view corresponding to line I-I' of FIG. 2A illustrating a modified embodiment of a 3D semiconductor memory device according to some exemplary embodiments of the present inventive concept.

FIG. 8 is a cross-sectional view corresponding to the line I-I' of FIG. 2A illustrating a modified embodiment of a 3D semiconductor memory device according to some exemplary embodiments of the present inventive concept. In the present exemplary embodiment of the present inventive concept, the descriptions to the same technical features as described in the exemplary embodiment of FIG. 7 may be omitted or mentioned briefly. A cell array of the present exemplary embodiment of the present inventive concept may be substantially the same as the cell array of FIG. 6 described above.

Referring to FIG. 8, to make uniform and stabilize program, read, and erase characteristics of the 3D semiconductor memory device, the dummy gate electrode DWL may be disposed adjacent to the contact portion of lower and upper channel structures CS1 and CS2. The upper horizontal insulator 280 covering top and bottom surfaces of the dummy gate electrode DWL may be disposed between the dummy gate electrode DWL and the upper insulating layers 210. The lower horizontal insulator 280 adjacent to the dummy gate electrode DWL may be disposed between the dummy gate electrode DWL and the upper channel structure CS2. The bottom surface of the second vertical semiconductor pattern 235 may be disposed at the same level as or a higher level than the top surface of the dummy gate electrode DWL.

In exemplary embodiments of the present inventive concept, the dummy gate electrode DWL may be disposed in the upper portion of the lower stack structure SS1. The dummy gate electrode DWL may be a contact portion of the lower and upper stack structures SS1 and SS2. The lower horizontal insulator 180 covering top and bottom surfaces of the dummy gate electrode DWL may be disposed between the dummy gate electrode DWL and the lower insulating layers 110. The lower horizontal insulator 180 adjacent to the dummy gate electrode DWL may be disposed between the dummy gate electrode DWL and the lower channel structure CS1. The top surface of the first vertical semiconductor pattern 135 may be disposed at the same level as or a lower level than the bottom surface of the dummy gate electrode DWL.

Since the dummy gate electrode DWL may be adjacent to the contact portion of the lower and upper channel structures CS1 and CS2, the occurrence of a non-uniform channel characteristic of the 3D semiconductor memory device may be reduced or prevented.

Figure 9:
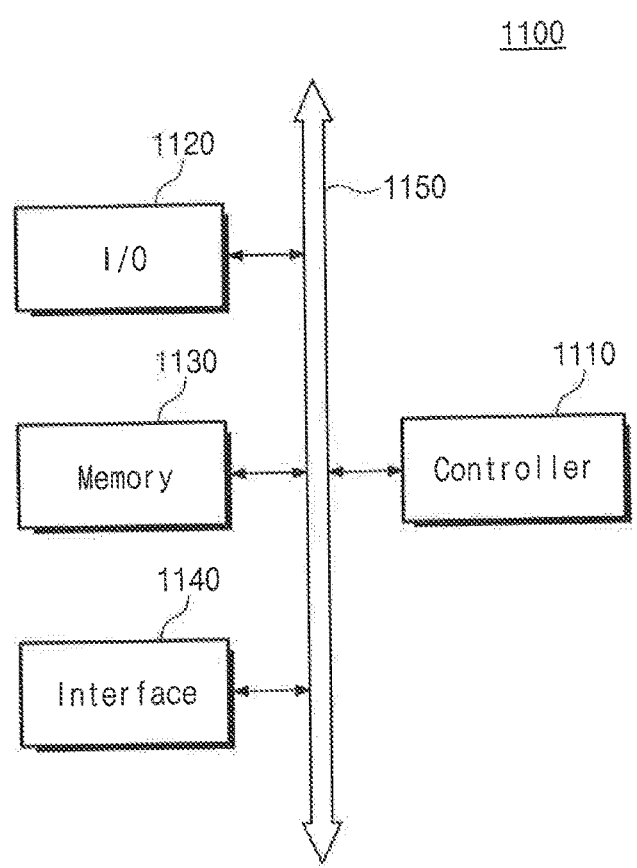
FIG. 9 is a schematic block diagram illustrating an example of a memory system including a 3D semiconductor memory device according to some exemplary embodiments of the present inventive concept.

FIG. 9 is a schematic block diagram illustrating an example of a memory system including a 3D semiconductor memory device according to an exemplary embodiment of the present inventive concept.

Referring to FIG. 9, a memory system 1100 may be used in a personal digital assistant (PDA), a portable computer, a web tablet, a wireless phone, a mobile phone, a digital music player, a memory card, or other electronic products receiving and/or transmitting information data by wireless.

The memory system 1100 may include a controller 1110, an input/output (I/O) unit 1120, a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic devices. Functions of the other logic devices may be similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include at least one of the 3D semiconductor memory devices according to exemplary embodiments of the present inventive concept. The memory device 1130 may include at least one of another type of semiconductor memory device or volatile random access memory devices.

The interface unit 1140 may transmit electrical data to a communication network or may receive electrical data from a communication network.

The 3D semiconductor memory device or the memory system according to some exemplary embodiments of the present inventive concept may be packaged using various packaging techniques. For example, the 3D semiconductor memory device or the memory system according to the exemplary embodiments of the present inventive concept may be packaged using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 10:
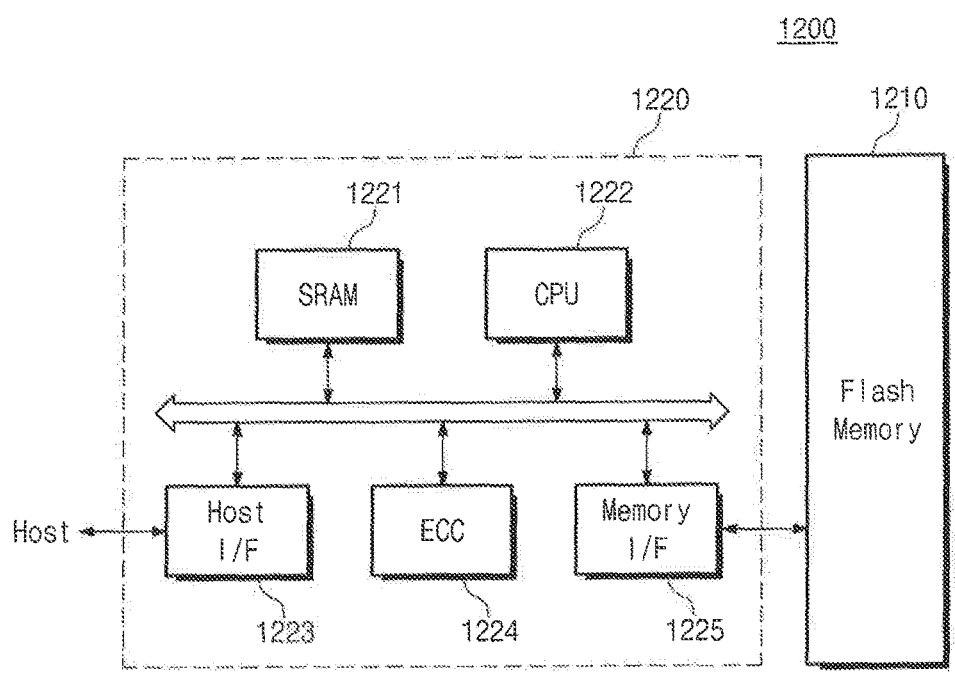
FIG. 10 is a schematic block diagram illustrating an example of a memory card including a 3D semiconductor memory device according to some exemplary embodiments of the present inventive concept.

FIG. 10 is a schematic block diagram illustrating an example of a memory card including a 3D semiconductor memory device according to some exemplary embodiments of the present inventive concept.

Referring to FIG. 10, a memory card 1200 for storing high-capacity data may include a flash memory device 1210 included in at least one of the 3D semiconductor memory devices according to the exemplary embodiments of the present inventive concept. The memory card 1200 may include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the data storage device 1200 and the host. An error check and correction (ECC) block 1224 may detect and correct errors of data which are read out from the flash memory device 1210. A memory interface unit 1225 may interface with the flash memory device 1210. The CPU 1222 may control overall operations of the memory controller 1220 for exchanging data. Even though not shown in the drawings, the memory card 1200 may include a read only memory (ROM) storing code data for interfacing with the host.

Figure 11:
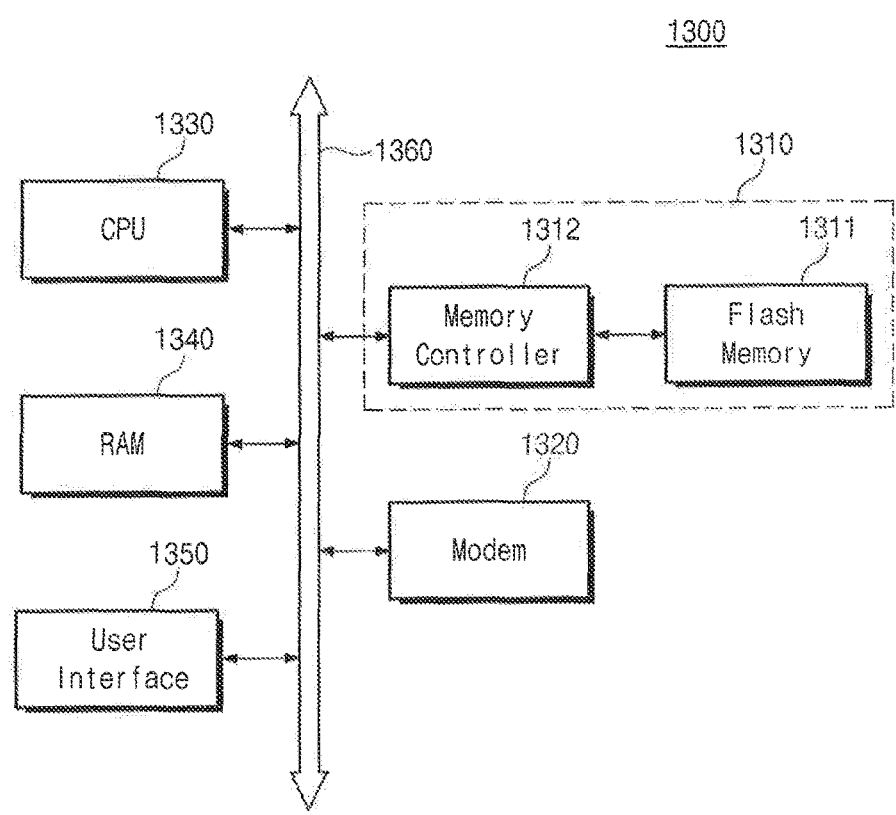
FIG. 11 is a schematic block diagram illustrating an example of an information processing system including a 3D semiconductor memory device according to some exemplary embodiments of the present inventive concept.

FIG. 11 is a schematic block diagram illustrating an example of an information processing system including a 3D semiconductor memory device according to some exemplary embodiments of the present inventive concept.

Referring to FIG. 11, an information processing system 1300 (e.g., a mobile device or a desktop computer) may include a flash memory system 1310 included in at least one of the 3D semiconductor memory devices according to exemplary embodiments of the present inventive concept. The flash memory system 1310 may include a memory controller 1312 and a flash memory 1311. The information processing system 1300 may include a modem 1320, a central processing unit (CPU) 1330, a random access memory (RAM) device 1340, and a user interface unit 1350 which may be electrically connected to the flash memory system 1310 through a system bus 1360. The flash memory system 1310 may be substantially the same as the memory system 1100 or the memory card 1200 described above. The flash memory system 1310 may store data inputted from an external system and/or data processed by the CPU 1330. In some exemplary embodiments of the present inventive concept, the flash memory system 1310 may include a solid state disk (SSD). In this case, the information processing system 1330 may stably store data into the flash memory system 1310. As reliability of the flash memory system 1310 increases, the flash memory system 1310 may reduce a resource consumed for correcting errors. Even though not shown in the drawings, an application chipset, a camera image processor (CIS), and an input/output unit may be included in the information processing system 1300.

The 3D semiconductor memory device according to exemplary embodiments of the present inventive concept may prevent the upper channel structure from being screened by the lower channel structure, so it is possible to secure the smooth path of electrons and/or holes between the lower channel structure and the upper channel structure.

While the present inventive concept has been particularly shown and described with reference to exemplary embodiments thereof, it will be understood by those of ordinary skill in the art that various changes in form and detail may be made therein without departing from the spirit and scope of the present inventive concept, as defined by the following claims.

What is claimed is:

1. A semiconductor device comprising:
   a lower stack structure including lower gate electrodes and lower insulating layers, wherein the lower gate electrodes and the lower insulating layers are alternately and repeatedly stacked on a substrate;
   an upper stack structure including upper gate electrodes and upper insulating layers, wherein the upper gate electrodes and the upper insulating layers are alternately and repeatedly stacked on the lower stack structure;
   a lower channel structure penetrating the lower stack structure, wherein the lower channel structure is connected to the substrate;
   an upper channel structure penetrating the upper stack structure, wherein the upper channel structure is connected to the lower channel structure; and
   a lower vertical insulator disposed between the lower stack structure and the lower channel structure;
   an upper vertical insulator disposed between the upper stack structure and the upper channel structure,
   wherein the lower channel structure comprises: a first vertical semiconductor pattern connected to the substrate; and a first connecting semiconductor pattern disposed on the first vertical semiconductor pattern,
   wherein the upper channel structure comprises: a second vertical semiconductor pattern electrically connected to the first vertical semiconductor pattern with the first connecting semiconductor pattern disposed therebetween,
   wherein an inner sidewall of an upper portion of the lower vertical insulator is in direct contact with an outer sidewall of a lower portion of the upper vertical insulator,
   wherein an outer sidewall of the second vertical semiconductor pattern has a stepped profile at a contact portion between the lower stack structure and the upper stack structure,
   wherein an outer sidewall of the upper vertical insulator has a stepped profile at a contact portion between the lower stack structure and the upper stack structure,
   wherein an uppermost level of the stepped profile of the outer sidewall of the second vertical semiconductor pattern is positioned below an uppermost level of the stepped profile of the outer sidewall of the upper vertical insulator, and
   wherein a diameter of the second vertical semiconductor pattern gradually decreases along a direction moving from the upper stack structure to an upper portion of the lower stack structure.

2. The semiconductor device of claim 1, wherein a top surface of the lower vertical insulator is in direct contact with a bottom surface of an upper insulating layer of the upper stack structure, and wherein the top surface of the lower vertical insulator is substantially coplanar with a top surface of the lower stack structure.

3. The semiconductor device of claim 1, wherein the first connecting semiconductor pattern includes N-type dopants.

4. The semiconductor device of claim 1, wherein the upper channel structure penetrates the upper stack structure and an upper portion of the lower stack structure, and
   wherein the second vertical semiconductor pattern is in direct contact with the first connecting semiconductor pattern disposed in the upper portion of the lower stack structure.

5. The semiconductor device of claim 1, wherein a bottom portion of the second vertical semiconductor pattern is disposed in a recessed hole, and wherein the recessed hole is disposed between the first connecting semiconductor pattern and the upper stack structure.

6. The semiconductor device of claim 1, further comprising an upper filling insulation layer penetrating the upper stack structure,
   wherein a lower surface of the upper filling insulation layer is positioned below the top surface of the lower vertical insulator, and
   wherein the upper filling insulation layer has a stepped pattern below the top surface of the lower vertical insulator.

7. The semiconductor device of claim 1, wherein an inner sidewall of the stepped profile of the upper vertical insulator is in direct contact with the stepped profile of the outer sidewall of the second vertical semiconductor pattern.

8. A semiconductor device comprising:
   a lower stack structure including lower gate electrodes and lower insulating layers, wherein the lower gate electrodes and the lower insulating layers are alternately and repeatedly stacked on a substrate;
an upper stack structure including upper gate electrodes and upper insulating layers, wherein the upper gate electrodes and the upper insulating layers are alternately and repeatedly stacked on the lower stack structure;
a lower channel structure penetrating the lower stack structure, wherein the lower channel structure is connected to the substrate;
an upper channel structure penetrating the upper stack structure, wherein the upper channel structure is connected to the lower channel structure;
an upper vertical insulator disposed between the upper stack structure and the upper channel structure,
wherein the lower channel structure comprises: a first vertical semiconductor pattern connected to the substrate; and a first connecting semiconductor pattern disposed on the first vertical semiconductor pattern,
wherein the upper channel structure comprises: a second vertical semiconductor pattern forming a recessed hole below a top surface of the lower stack structure, the second vertical semiconductor pattern electrically connected to the first vertical semiconductor pattern with the first connecting semiconductor pattern disposed therebetween,
wherein a bottom surface of the upper vertical insulator is positioned below the top surface of the lower stack structure, and wherein the upper vertical insulator has a stepped pattern adjacent to the recessed hole and adjacent to the top surface of the lower stack structure,
wherein the bottom surface of the upper vertical insulator is in direct contact with an upper surface of the first connecting semiconductor pattern, and
wherein a diameter of the second vertical semiconductor pattern gradually decreases along a direction moving from the upper stack structure to an upper portion of the lower stack structure.

9. The semiconductor device of claim 8, further comprising a lower vertical insulator disposed between the lower stack structure and the lower channel structure,
wherein a top surface of the lower vertical insulator is substantially coplanar with the top surface of the lower stack structure.

10. The semiconductor device of claim 8, wherein the first connecting semiconductor pattern includes N-type dopants.

11. The semiconductor device of claim 8, wherein the upper channel structure penetrates the upper stack structure and an upper portion of the lower stack structure, and
wherein the second vertical semiconductor pattern is in direct contact with the first connecting semiconductor pattern disposed in the upper portion of the lower stack structure.

12. A semiconductor device comprising:
a lower stack structure including lower gate electrodes and lower insulating layers, wherein the lower gate electrodes and the lower insulating layers are alternately and repeatedly stacked on a substrate;
an upper stack structure including upper gate electrodes and upper insulating layers, wherein the upper gate electrodes and the upper insulating layers are alternately and repeatedly stacked on the lower stack structure;
a lower channel structure penetrating the lower stack structure, wherein the lower channel structure is connected to the substrate;
an upper channel structure penetrating the upper stack structure and electrically connected to the lower channel structure; and
an upper vertical insulator disposed between the upper stack structure and the upper channel structure,
wherein a lower portion of the upper channel structure is provided in a recessed hole below a top surface of an uppermost one of the lower insulating layers,
wherein a lower portion of the upper vertical insulator provided in the recessed hole includes:
a first portion horizontally extending on the lower portion of the upper channel structure, a top surface of the first portion being substantially coplanar with the top surface of the uppermost one of the lower insulating layers;
a second portion vertically extending along with a sidewall of the lower portion of the upper channel structure,
wherein a bottom surface of the upper vertical insulator is in direct contact with an upper surface of a first connecting semiconductor pattern of the lower channel structure; and
a lower vertical insulator disposed between the lower stack structure and the lower channel structure,
wherein a top surface of the lower vertical insulator is substantially coplanar with the top surface of the uppermost one of the lower insulating layers, and
wherein a diameter of the upper channel structure gradually narrows along a direction moving from the upper channel structure towards the lower channel structure.

13. The semiconductor device of claim 12, wherein the lower channel structure comprises: a first vertical semiconductor pattern connected to the substrate; and the first connecting semiconductor pattern disposed on the first vertical semiconductor pattern, and
wherein the upper channel structure comprises: a second vertical semiconductor pattern electrically connected to the first vertical semiconductor pattern with the first connecting semiconductor pattern disposed therebetween.

14. The semiconductor device of claim 13, wherein the upper channel structure penetrates the upper stack structure and an upper portion of the lower stack structure, and
wherein the second vertical semiconductor pattern is in direct contact with the first connecting semiconductor pattern disposed in the upper portion of the lower stack structure.

15. The semiconductor device of claim 13, wherein a bottom portion of the second vertical semiconductor pattern is disposed in the recessed hole, and wherein the recessed hole is disposed between the first connecting semiconductor pattern and the upper stack structure.

* * * * *